US005857368A

United States Patent [19]
Grunes et al.

[11] Patent Number: 5,857,368
[45] Date of Patent: Jan. 12, 1999

[54] APPARATUS AND METHOD FOR FABRICATING METAL PATHS IN SEMICONDUCTOR SUBSTRATES THROUGH HIGH PRESSURE EXTRUSION

[75] Inventors: Howard Grunes, Santa Cruz; Stephen J. Blumenkranz, Redwood City; Eric C. Williams, Los Gatos, all of Calif.; Richard Koch Reber, Erie, Pa.

[73] Assignee: Applied Materials, Inc., Santa Clara, Calif.

[21] Appl. No.: 561,614

[22] Filed: Nov. 21, 1995

Related U.S. Application Data

[60] Provisional application No. 60/004,936, Oct. 6, 1995.
[51] Int. Cl.$^6$ ............................ H01L 21/00; B21D 26/02
[52] U.S. Cl. ................................ 72/54; 72/342.7; 29/530
[58] Field of Search ..................... 72/54, 56, 60, 72/63, 342.7; 29/521, 530

[56] References Cited

U.S. PATENT DOCUMENTS

| | | | |
|---|---|---|---|
| 2,728,317 | 12/1955 | Clevenger et al. | 72/60 |
| 3,052,188 | 9/1962 | Wolf et al. . | |
| 3,681,958 | 8/1972 | Rasmussen | 72/60 |
| 3,974,673 | 8/1976 | Fosness et al. | 72/56 |
| 4,100,783 | 7/1978 | Gambarov et al. | 72/56 |
| 4,112,724 | 9/1978 | Claesson et al. | 72/63 |
| 4,676,086 | 6/1987 | Hellgren | 72/60 |
| 4,951,491 | 8/1990 | Lorenz | 72/60 |
| 5,011,793 | 4/1991 | Obinata . | |
| 5,214,949 | 6/1993 | Cadwell | 72/60 |
| 5,277,045 | 1/1994 | Mahoney et al. | 72/60 |
| 5,553,474 | 9/1996 | Nokajima et al. | 72/60 |
| 5,568,742 | 10/1996 | Bauer | 72/61 |

FOREIGN PATENT DOCUMENTS

| | | |
|---|---|---|
| 0 516 344 A1 | 12/1992 | European Pat. Off. . |
| 405015931 | 1/1993 | Japan ................. 72/60 |
| PCT/GB92/ 01940 | 10/1992 | WIPO . |
| WO 93/08591 | 4/1993 | WIPO . |

Primary Examiner—David Jones
Attorney, Agent, or Firm—Townsend and Townsend and Crew LLP

[57] ABSTRACT

A high pressure metallization apparatus provides a chamber for enclosing or enveloping a substrate in a high pressure environment, and thereby extrude a film layer into any voids in the covers holes or trenches thereon. The high pressure is maintained in a pressure chamber, which is substantially enclosed within a vacuum chamber. The apparatus includes a positioning member which relatively rigidly positions the pressure chamber plugs during high pressure operations, and also allows separation of the plugs to enable pressure chamber access. The apparatus is configured for relatively rapid access to the internal components thereof, for rapid service and cleaning turnaround. Additionally, the chamber is configured to have minimal relative movement between the structural elements thereof, to reduce particle generation in the apparatus.

90 Claims, 25 Drawing Sheets

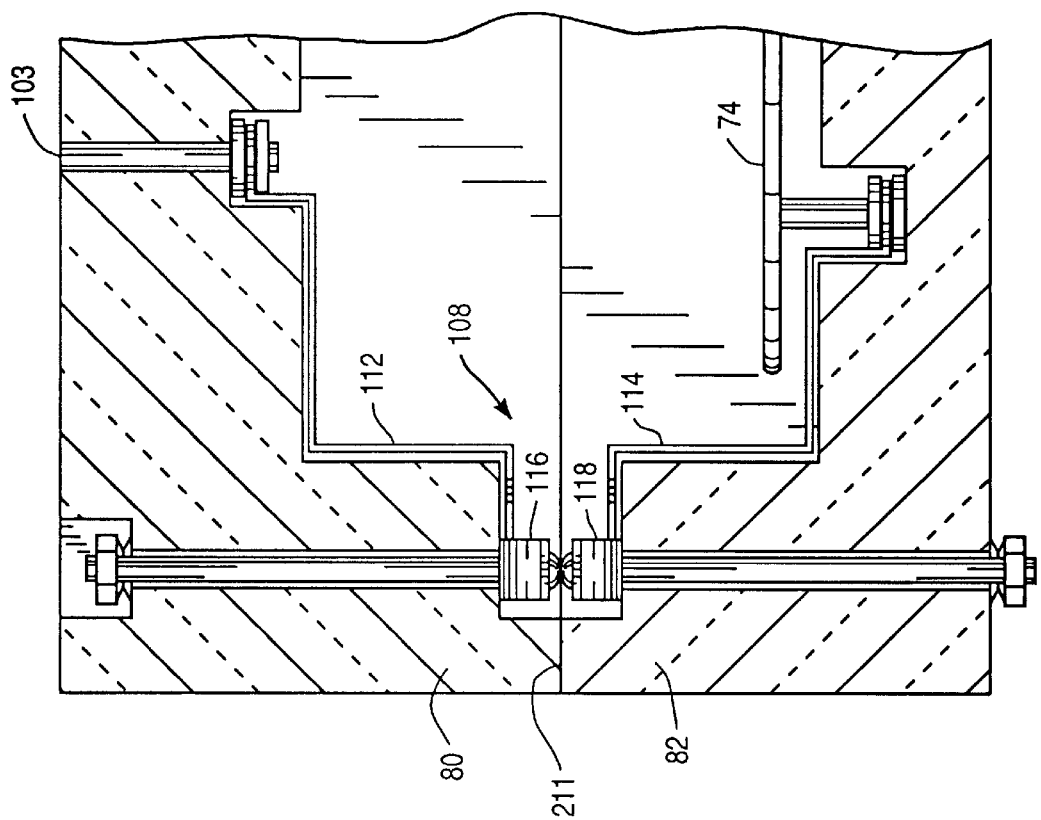
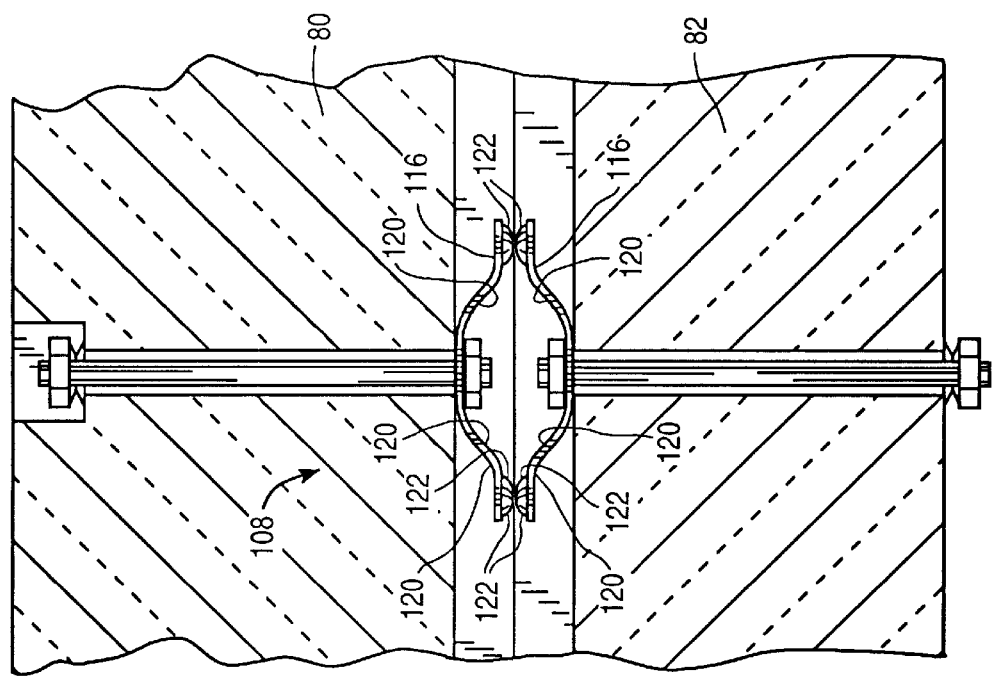

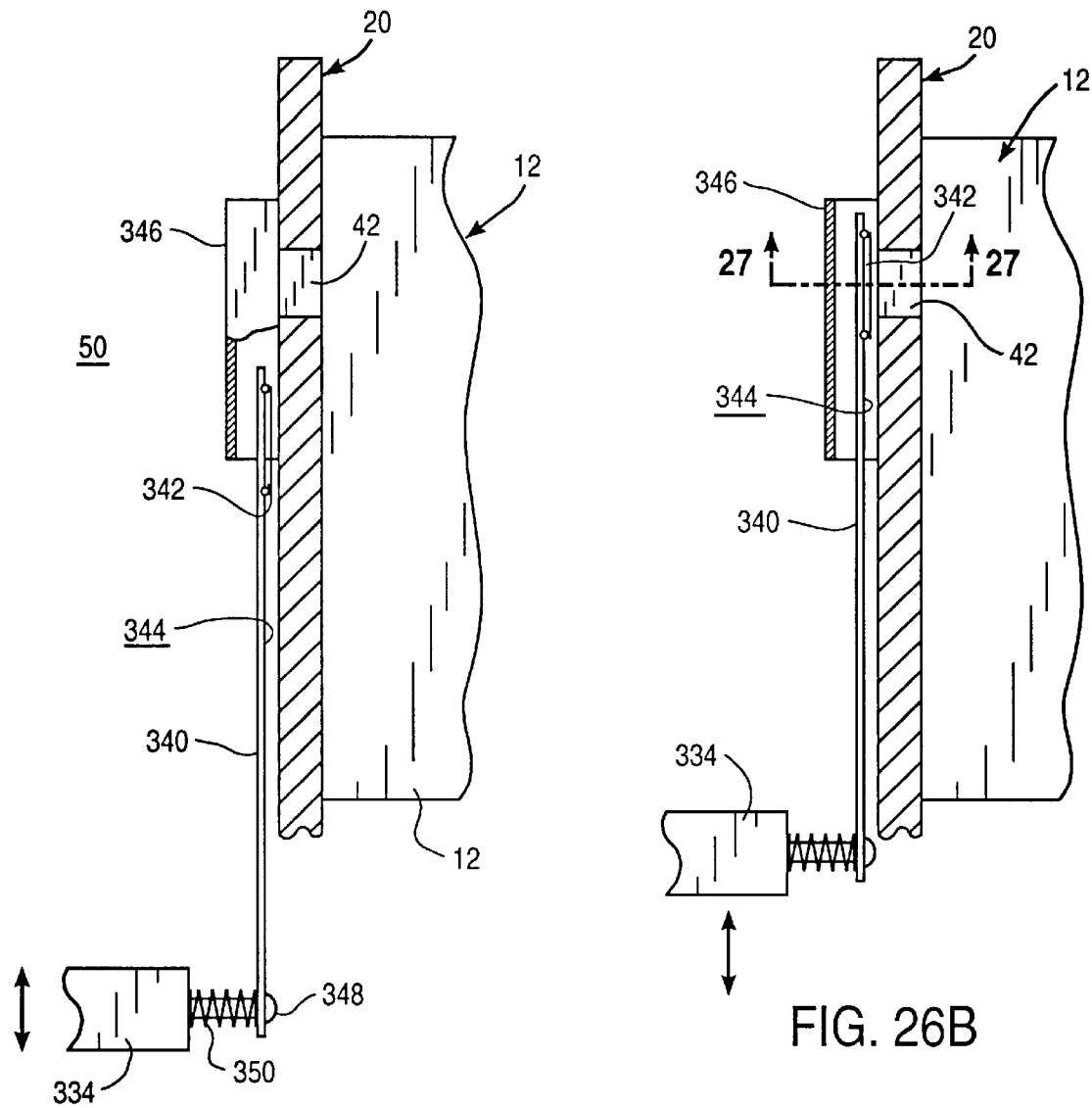
FIG. 26A
FIG. 26B
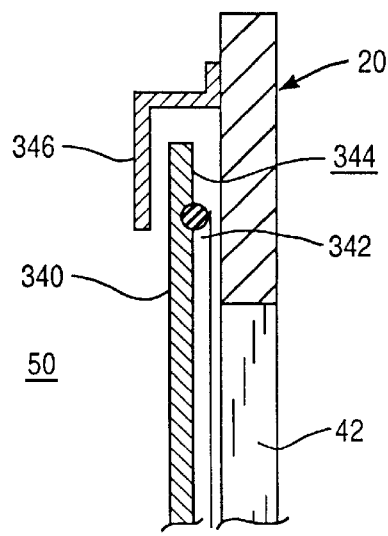
FIG. 27

APPARATUS AND METHOD FOR FABRICATING METAL PATHS IN SEMICONDUCTOR SUBSTRATES THROUGH HIGH PRESSURE EXTRUSION

This application claims the benefit of U.S. Provisional Application No. 60/004,936, filed Oct. 06, 1995.

1. Background of the Invention

The present invention relates to the filling of holes or trenches during semiconductor device fabrication. More particularly, the invention relates to the filling of such holes and trenches, wherein a film layer, such as a metal or dielectric layer, is deposited over the hole or trench to seal the hole or trench, and the film layer is then exposed to high pressure conditions to enable extrusion of the metal layer into the hole or trench.

2. Background of the Art

Semiconductor device fabrication techniques have been traditionally performed by depositing film layers on substrates, etching holes or trenches in the film layer, and then filling the hole or trench with a second deposition material. For example, a dielectric material may be deposited over a metal layer previously deposited on the substrate, and then etched to provide holes or trenches therethrough to create a path through or along the dielectric layer. Metal is then deposited into the holes or trenches to provide the conductive path through or along the dielectric layer.

One suggested method of providing hole filling is by hot (HIP) or cold (CIP) isostatic pressing. In these techniques, a substrate, having an etched film layer thereon, is located in a deposition chamber, and a film is deposited over the etched film layer under vacuum conditions. The substrate is then moved into a second chamber, wherein the substrate is exposed to a high surrounding pressure on the order of several thousand p.s.i. Because the substrate is surrounded by the pressure, the only location on the substrate where a differential pressure exists is where the uppermost film layer extends over a partially or totally unfilled hole (or trench). The pressure is sufficient to extrude the film layer into the unfilled portions of the holes to fill the holes completely and eliminate any voids.

One problem with the CIP or HIP technique is that it requires a high pressures to provide the extrusion of the film layer into the holes, whereas most semiconductor fabrication operations, such as physical vapor deposition, require vacuum processing conditions. For this CIP or HIP method to be of practical use for semiconductor fabrication, the substrates should be passed from a vacuum to a high pressure environment without contamination, preferably through a common load lock or transfer chamber connection of the vacuum and high pressure process chambers. By doing so, the pressurized hole filling operation can occur immediately after the deposition layer has been formed on the substrate in a different chamber commonly coupled to the transfer chamber; this will ensure minimal change in the film characteristics between the deposition and hole filling operations. Additionally, the high pressure chamber must be maintainable at ultra-clean conditions, because any contamination in the chamber could contaminate one or more devices being formed on the substrate. Finally, the chamber must be susceptible of being easily accessed for servicing and cleaning in time periods comparable to those needed to service and clean the vacuum process chambers interfaced with the common load lock or transfer chamber. Finally, it may be preferable, for purposes of optimizing per wafer throughput, to dedicate a chamber system wherein the deposition chambers are used only for preparing a film layer on a substrate where the substrate is to be exposed to the high pressure regimen. Therefore, it is critical to overall wafer throughput that the serviceability of the pressure chamber is equivalent to that of the other chambers, particularly with respect to cleaning or repair turnaround times.

One apparatus for providing high pressure metallization is shown and described in PCT application number PCT/GB92/01940, filed Oct. 22, 1992. In the chamber configuration shown in this application, a pressurizable chamber is created by locating, within a vacuum containment vessel, a pair of rams, each of which has a facing hollowed out portion which, when the rams are brought into contact, forms a pressurization cavity. To access the pressurizable cavity, the vacuum containment vessel has a slit valve extending therethrough, and the rams both move away from the location of the slit valve. Thus, to operate the chamber, both the upper and the lower rams must be moved.

To operate the chamber, the lower ram and upper rams are moved with hydraulic pistons, to open the pressurizable cavity formed therebetween for the removal and replacement of the substrate positioned therein for processing. Once a new substrate has been placed into the hollowed out portion between the rams which forms the pressurizable cavity, the rams are hydraulically forced together by the cylinders to provide the pressurizable cavity within which the high pressure filling may be performed. The maintenance of the rams in contact, as the cavity is pressurized, is accomplished by sealing the hydraulic fluid supply to the cylinders after the cavity has been formed, to create a static hydraulic loading member from the piston cavity of the cylinder. Because the hydraulic fluid is substantially incompressible, the hydraulic fluid, once sealed in the cylinder, may be capable of supporting substantial loads without substantial creep of the cylinder piston into the cylinder. Thus, the elevated process pressure in the chamber or cavity will be supported by the cylinder. However, in the event that the hydraulic cylinder were to leak, the pressurizable chamber would tend to open because the hydraulic ram would tend to back off under the higher pressure of the pressurizable chamber. To prevent this, the apparatus includes an additional hydraulic circuit to allow the rams to move in unison if the lower ram, connected to the cylinder, begins to back-off during processing.

To form a bearing surface against which the hydraulic rams are grounded, the apparatus includes opposed end plugs, which are threaded into opposite ends of an outer housing. To limit the volume about the substrate cavity which must be evacuated, the rams are connected, about their periphery, to the inner surface of this housing. Additionally, the slit valve extends through this housing to connect the chamber to a cluster tool, and to support the chamber on that tool.

To form a seal between the two rams to seal the high pressure substrate cavity, the two rams include a frustroconical sealing surface on one of the rams, and a frustroconical lip on the other ram. As the rams are closed, the lip is located adjacent to, an in contact with, the frustroconical face. Then, as the cavity is pressurized, the lip deforms outwardly against the face to form a greater sealing surface between the two rams.

The described high pressure metallization device has several drawbacks from a reliability and substrate fabrication standpoint. First, the hydraulic loading of the rams, and the hydraulic locking of the loaded rams, will require numerous alarms and sensors to ensure that a hydraulic leak has not occurred. Additionally, although the hydraulic fluid sealed within the ram may be called "incompressible", all fluids have some compressibility, and also have changing compressibility characteristics as temperatures change. Therefore, the hydraulic cylinder will allow the lower ram to back off slightly when the chamber is pressurized. Additionally, to "fail-safe" the chamber in the event of hydraulic leaks, multiple seals and bellows, which will be leak sources and constant maintenance items, are located throughout the chamber. Further, the threading of the end caps into the outer housing means that the end caps are difficult to remove, which increases the turnaround time for chamber maintenance. Finally, the movement of the sealing surfaces in and out of contact creates an unacceptable risk of particulate contamination of a substrate, and the loading and unloading of the lip against the frustroconical face can lead to failure of the entire ram in which the lip is located.

Therefore, there is a need in the art for a high pressure filling chamber having minimal moveable parts, easily reproducible loading and unloading of the pressure chamber, easy maintenance access and minimal particle generation.

SUMMARY OF THE INVENTION

The present invention provides a high pressure chamber for high pressure filling of holes and trenches with an overlying film layer having vacuum loadlock capability, easy access for service and minimal contacting of moving parts for low particle generation. In one aspect, the invention provides a chamber having an outer vacuum containment portion accessible with a slit valve extending therethrough, a high pressure chamber located within the vacuum containment portion, a chamber opening device located outwardly of the vacuum containment from the pressure chamber and communicable with the pressure chamber through the vacuum containment, and a reaction frame surrounding these components. The pressure chamber preferably includes an upper plug, a lower plug, and a pair of ring-shaped bodies which provide the structural containment of the high pressure region maintained within the envelope of the bodies and plugs forming the high pressure chamber. The manipulation of the high pressure chamber components to open and close the chamber is uniquely provided by a mechanical chamber opening device, which preferably selectively and rigidly positions the lower plug with respect to the position of the upper plug when pressurized processing is undertaken in the chamber, but also enables opening of the chamber, preferably by telescopically changing the position of portions of the opening device. Preferably, the upper plug is suspended from the reaction frame while the upper body is supported by the containment wall. The lower plug and the lower body are preferably variably positionable, with respect to the upper plug and upper body. In the chamber open position, the chamber positioning device is retracted, and the lower body and lower plug attached thereto are physically retracted from the upper plug and upper body to provide access into the pressurizable chamber. After a substrate is removed from the chamber, and a new substrate is placed therein, the chamber positioning device is extended, to position the lower body in contact with the upper body to form a seal for the pressurizable chamber. Gas is then introduced into the chamber to maintain a pressure on the order of 15 to 12,000 p.s.i. on the substrate to extrude the film layer into the holes or trenches on the substrate.

As the pressure chamber is pressurized, the pressure will tend to force the plugs and bodies apart at their regions or areas of contact. However, the seal between the lower plug and the lower body is located radially outwardly of the position of the seal between the two bodies. This keeps the lower body biased upwardly against the upper body. Downward movement of the lower plug is halted when the chamber positioning device abuts the reaction frame. The positioning of the lower plug by the chamber positioning device is a hard physical connection, i.e., a solid-on-solid connection exists between the lower plug (through the chamber positioning device) and the reaction frame. This is an improvement over hydraulic positioning devices since it eliminates failure of the connection due to slow or catastrophic leaks. To enable these loadings and relative movements, the seal between the lower plug and the lower body occurs between an outer circumferential face of the lower plug and an inner circumferential face of the lower body. The seal will be maintained as the circumferential faces move relative to one another as the pressure chamber is pressurized and depressurized.

The vacuum containment portion of the apparatus is preferably configured to be mounted to and supported by a cluster tool, i.e., a tool having a substrate handling or transfer chamber to which multiple processing chambers are attached, and accessible therewith through a slit valve, to enable placement of substrates into, and removal of substrates from, the pressure chamber without exposure thereof to ambient conditions. In one aspect of the invention, the reaction frame is supported on a carriage using, for example, stacks of belleville washers so that, with appropriate positioning and adjustments, the weight of the reaction frame is not transmitted to the cluster tool. Preferably, the reaction frame is biased upwardly, with respect to the bodies, by a slight magnitude of force, such as 5 pounds (1.87 kg) such that the weight of the reaction frame is not transferred through the connection between the reaction frame and the vacuum containment to the cluster tool.

In another aspect of the invention, the pressure chamber includes upper and lower heaters, which are used to maintain the substrate at an elevated temperature to enhance film layer flow into the holes. Preferably, both heaters are electric resistance heaters, the electric feeds for which extend through the upper plug. To enable the passage of electricity from the upper plug to the heater on the lower plug, a rolling contact connector is located at the interface of the two plugs. The rolling contact of the connector enables repeated connection and disconnection of the connector with minimal particle generation. Preferably, the lower heater provides the heat energy to maintain the substrate at the desired processing temperature, and the upper heater serves as a guard heater, i.e., it is maintained at a temperature at or near the substrate temperature, to reduce or eliminate heat-gradient-induced convection in the gas maintained between the substrate and the upper heater.

In another aspect of the invention, the pressure chamber is formed by providing an upper insulative member having a recess therein, and attaching this member to the upper plug, and providing a lower insulative member having a recess therein, and resting this member on the lower body. When the lower plug is moved upwardly, it moves the lower body and thus the lower insulative member upwardly, and the upper and lower insulative members are brought into close proximity to create the substrate cavity from the recesses. As the substrate is heated, these insulative members will be heated, at the location of the recesses, to temperatures which may substantially exceed the temperatures of the upper and middle regions of the insulative member, which will induce substantial thermal stress in the insulative members. Therefore, each of the insulative members is preferably configured as a multi-piece, typically a two-piece, member, which allows the portion of the insulative member within which the recess is located to expand radially without inducing thermal stresses in the portion of the insulative member furthest from the recesses.

The configuration of the insulative members as two piece members has an additional benefit: a gas supply manifold may be created between the two members to enable entry flow of the pressurizing gas into the substrate chamber of the device to flow inwardly from the entire perimeter of the cavity. In one aspect of the invention, a gas manifold is provided by porting the pressure gas supply to a manifold region between the upper insulative member and the upper plug and providing a plurality of bores from the manifold downwardly to the perimeter of the lowermost of the upper insulative members. Most preferably, the bores enter into a circumferential secondary manifold, or channel, within which the gas from the pressure supply coalesces into a blanket of gas which may then enter the substrate chamber from the entire perimeter of the chamber to uniformly fill the chamber. This reduces gas flow speeds to reduce turbulence within the substrate chamber to help prevent movement of the substrate or contamination of the substrate by particles which could be stirred up by turbulent flow.

In another aspect of the invention, the pressurizing gas is preheated to a temperature of the lowest temperature pressure chamber component with which it will contact during its introduction into the apparatus, prior to its introduction into the pressure chamber. This reduces cycle time, chamber internal heater power requirements, and reduces thermal cycling, and thus thermal expansion stress cycling, of the pressure chamber components.

As the pressure chamber is pressurized, the upper and lower bodies will expand radially under the high pressure conditions in the chamber, but the end plugs will not. Therefore, a potential particle contamination source exists where the upper and lower plugs contact the bodies and between the bodies. Additionally, under the loads induced between the components under the high pressure conditions maintained in the chamber, the bodies may become jammed, by frictional loading, against the plugs or against each other. In one aspect of the invention, this problem is ameliorated, or eliminated, by maintaining the contact between the lower plug and lower body through the lower chamber seal, and providing a secondary, low friction, protective slip plate between the upper plug and upper body. The slip plate is configured from or coated with a low coefficient of friction material, to enable low friction and thus low particle generation, relative movement between the upper plug and upper body while at the same time reducing frictional load forces induced between the radially expandable and contractible body and the plug. Additionally, the chamber seal between the upper plug and upper body is preferably located between the high pressure region of the pressure chamber and the slip plate, which ensures that any particles generated by relative motion between these parts is created outside of the pressure chamber.

The relative or differential expansion of the bodies under the chamber pressure could also create unacceptable internal stresses in the bodies, or unacceptable high contact pressure or relative motion between the bodies at their region of contact which may lead to the generation of particles. Therefore, the bodies are preferably configured to expand and contract by equal amounts at their region of contact under the pressure cycling of the pressure chamber, and they are also configured to equally expand internally and at all axial heights, to reduce internal stresses induced by differential expansion of different portions thereof. This is achieved, in part, by designing the bodies to expand about their approximate centers, thereby changing size equally in all directions due to temperature change.

The initial design of the pressure vessel components for the preferred embodiment was done within the constraints of ASME Section 8 Division 2 pressure vessel code, and design envelope afforded by the cluster tool environment. The pressure vessel components include the upper and lower bodies, the upper and lower plugs, the rotating finger plate, and the reaction frame. Subsequently, the reaction frame and upper and lower body designs were optimized. The critical dimensions and features of each part were determined by performing a structural optimization using finite element analysis. The basic geometry, material properties, loads and boundary conditions are used to create a mathematical model which is capable of accurately simulating the structural response of each component. The analysis code is capable of optimizing the shape to satisfy specified requirements, in this case minimize stress, by varying key dimensions specified by the analyst, while maintaining certain constraints, such as ASME code requirements, and ease of manufacture. The upper and lower bodies were optimized to minimize stress, reduce twisting, and match the radial displacement at the face seal location in order to prevent metal-to-metal sliding during each pressurization cycle. The results of this analysis were upper and lower body designs having relief grooves which tend to structurally balance the cross section. This analysis was also performed to minimize stress in the reaction frame, and the result was a unique stress relief shape located at the junction of the vertical webs and the end cross-members. By lowering the stress field, the fatigue life of the part was increased.

These and other features of the invention, and advantages thereof, will be apparent from the following Description of the Embodiments, when read in conjunction with the accompanying drawings, wherein:

BRIEF DESCRIPTION OF THE DRAWINGS

FIG. 5 is an enlarged sectional view of a portion of the chamber shown in FIG. 3, showing the details of the electrical contact for the lower heater element;

FIG. 6 is an additional enlarged sectional view of the chamber shown in FIG. 3, showing additional details of the electrical contact for the lower heater element;

FIGS. 26A and 26B illustrate the use of a protective door in lowered and raised positions, the protective door used to cover the slit valve when the pressurizable cavity is pressurized; and FIG. 27 is a cross-sectional view taken along line 27—27 of FIG. 26B.

DESCRIPTION OF EMBODIMENTS

The present invention provides methods and apparatuses for providing high pressure filling of holes and trenches in substrates. Although the invention is particularly useful for providing filling of high aspect ratio holes with conductors such as aluminum and copper, where other techniques are incapable of providing such filling, the apparatus and methods of the present invention may be used for any hole-filling application where a film layer may be formed over and seal a trench or hole, and it is desired to fill the hole or trench with the film layer material.

Figure 1A:
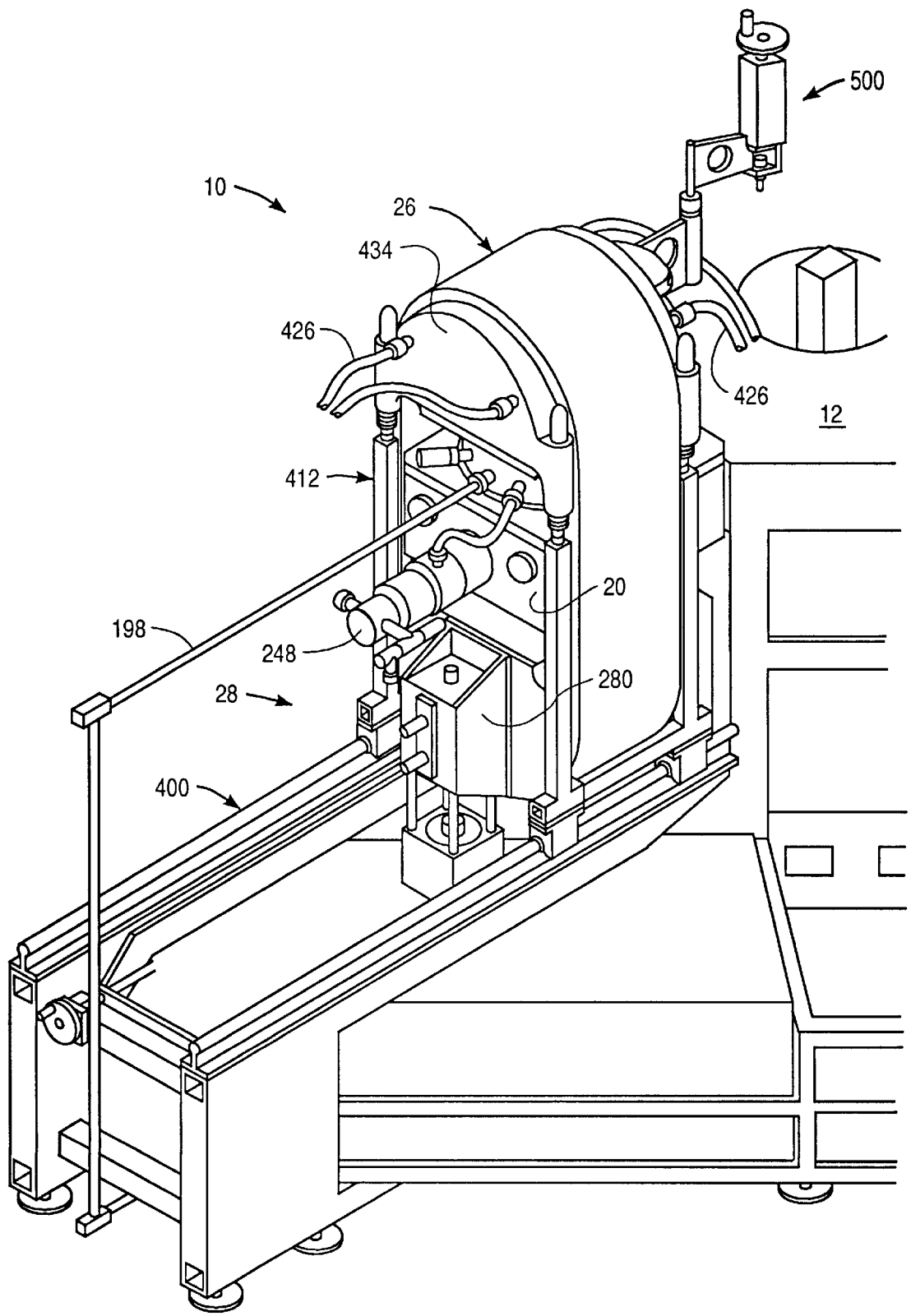
FIG. 1A is an overall view of a representative high pressure metallization chamber of the present invention installed on a transfer chamber of a cluster tool.
Figure 1B:
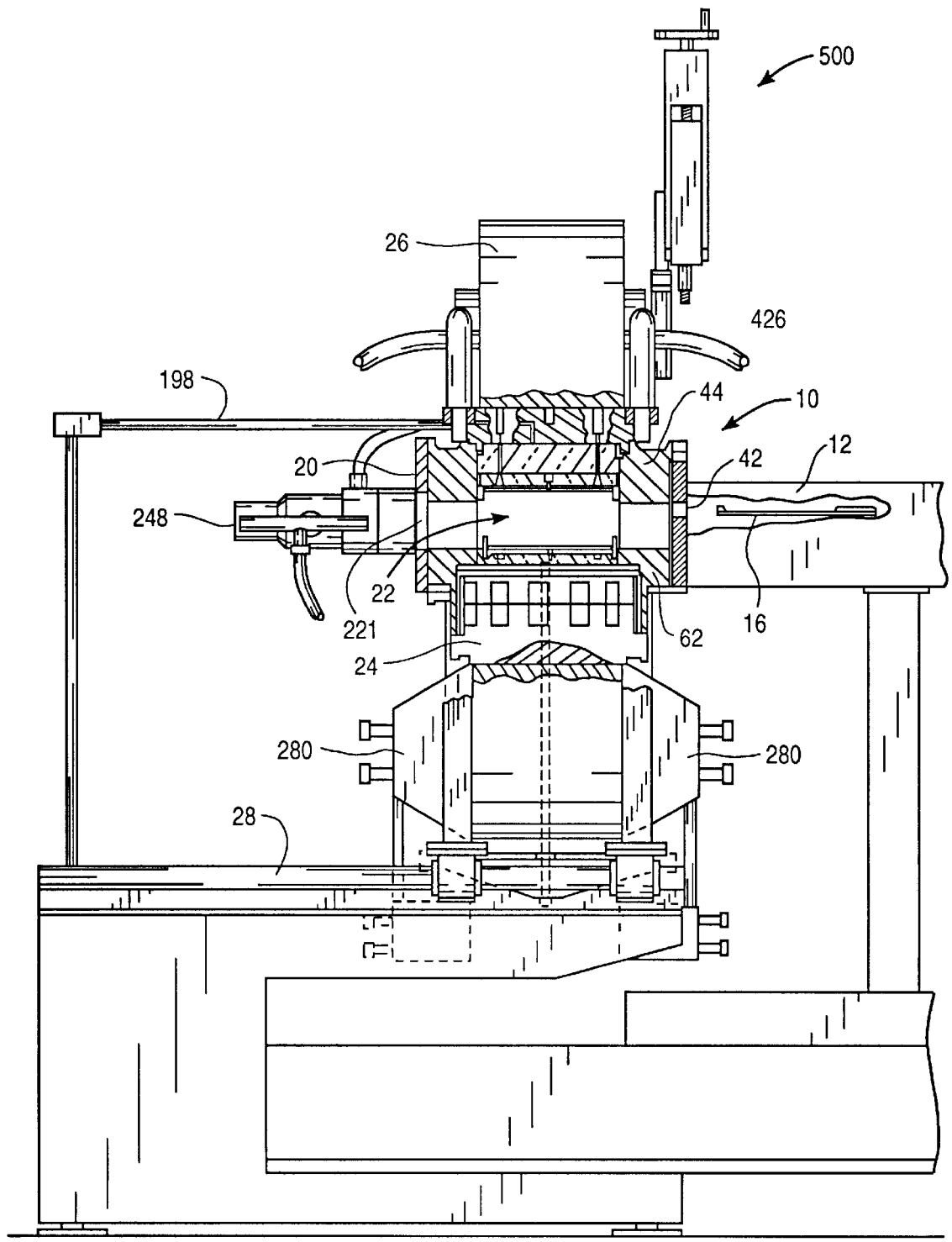
FIG. 1B is a side view of the apparatus of FIG. 1A with portions broken away.
Figure 2A:
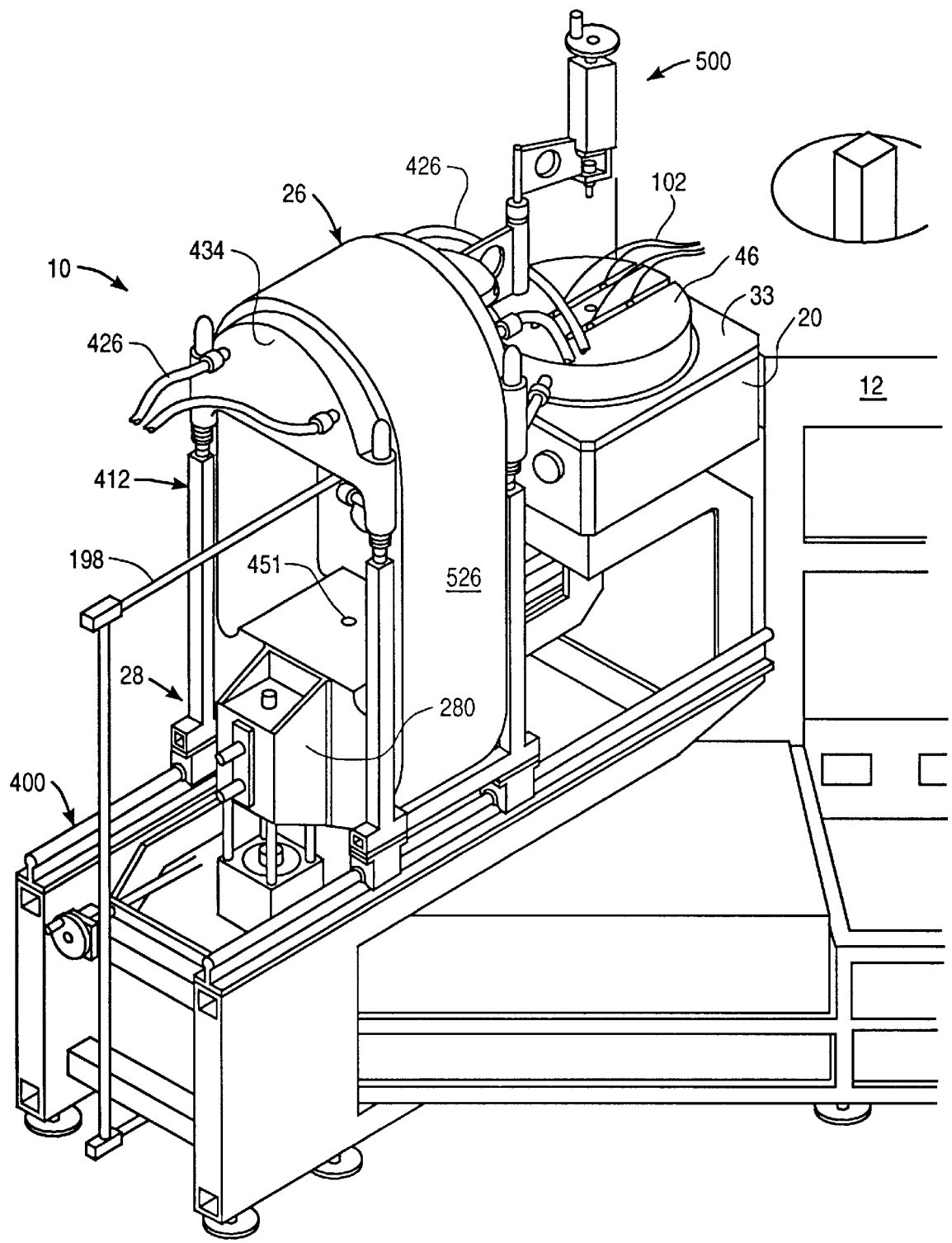
FIG. 2A is an additional overall view of the apparatus of FIG. 1A, showing the reaction frame in the rolled away position to enable servicing of the pressure chamber components.
Figure 2B:
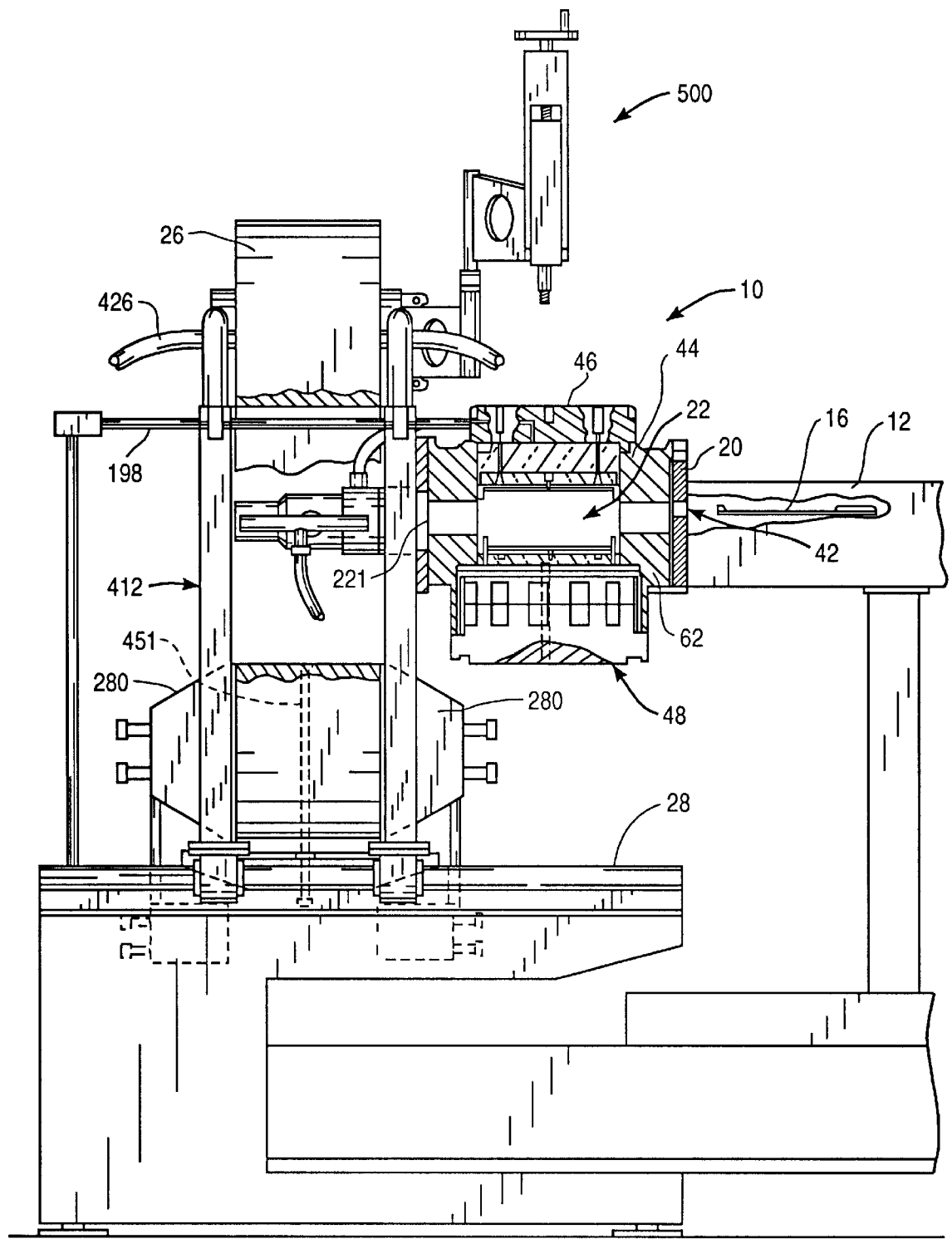
FIG. 2B is a side view of the apparatus of FIG. 2A with portions broken away.

Referring to FIGS. 1A and 1B, there is generally shown a high pressure hole filing apparatus 10 which is attached to a cluster tool 12. Generally, the apparatus 10 includes a vacuum containment vessel 20, which is directly mounted to the cluster tool 12 and within which a pressure chamber 22 is received, and a reaction frame 26 surrounding the vacuum containment vessel 20 and supported on a carriage 28. Additionally, a positioning assembly 24 (see FIG. 1B) is provided to enable opening and closing of the pressure chamber 22 within the confines of the vacuum containment vessel 20. In the preferred implementation of the invention, the carriage 28 may enable the reaction frame 26 to be rolled away from the cluster tool 12 as shown in FIGS. 2A and 2B, to remove the reaction frame 26 from the perimeter of the vacuum containment vessel 20. With the reaction frame 26 in this position, the vacuum containment vessel 20, and thus the pressure chamber 22 therein, may be opened for servicing of the components thereof using the lifting apparatus 500 shown in FIGS. 1A–2B, 17 and 18.

Figure 3:
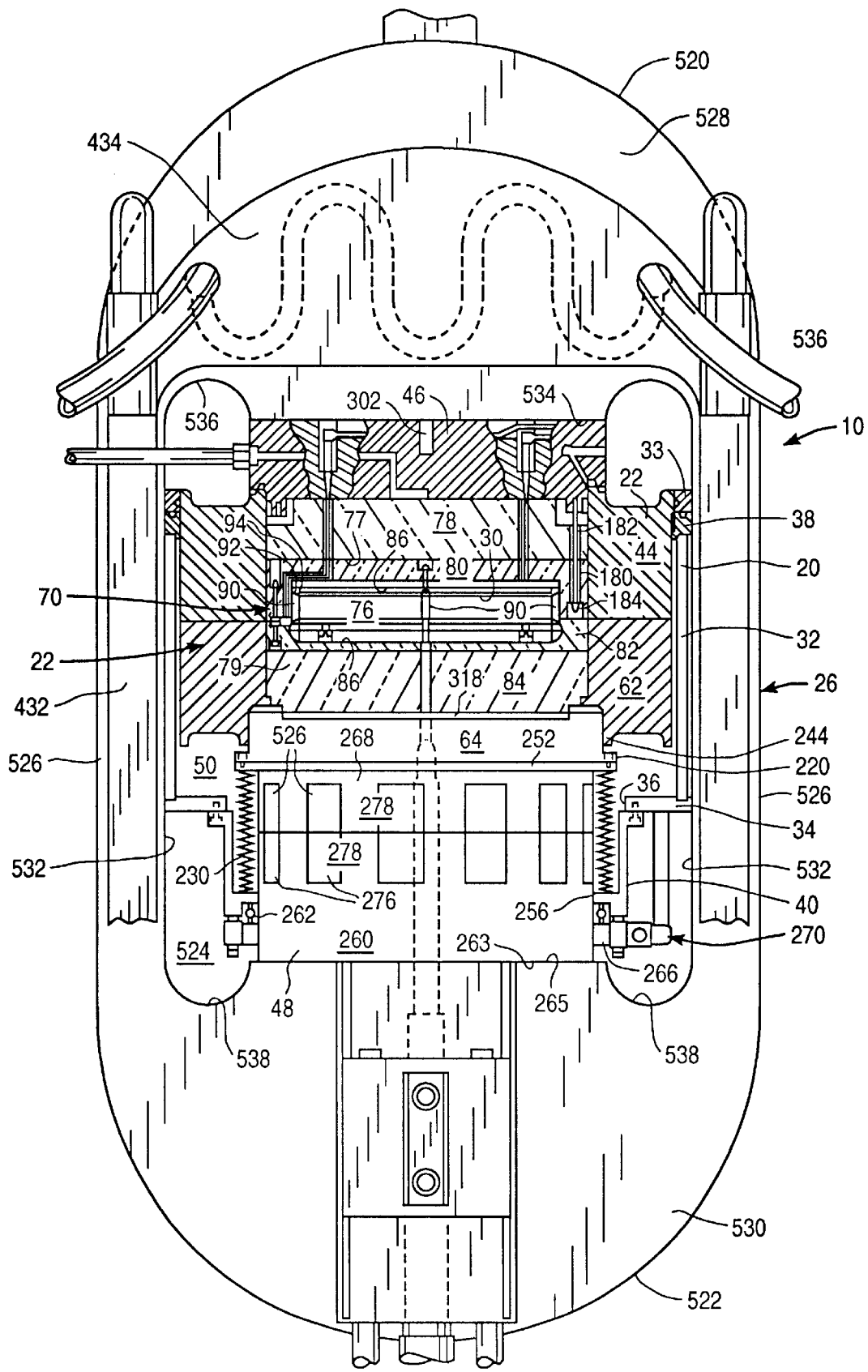
FIG. 3 is a sectional view of the chamber of FIG. 1, from an additional side perspective rotated 90 degrees from the side view of FIG. 1 shown with the substrate chamber pressurized.

Referring now to FIG. 3, there is shown, in section, the configuration of the pressure chamber 22, vacuum containment vessel 20 and reaction frame 26. In the view of the apparatus of FIG. 3, the apparatus 10 is in a closed and pressurized configuration, wherein a substrate 30 is located in the pressure chamber for filling of the holes or trenches therein through a high pressure process.

The vacuum containment vessel 20 generally includes an outer, rectangular, circumferential wall 32 supported on the perimeter of an annular base plate 34 and having a central circular aperture 36 therethrough, a rectangular plate 38 located on the upper perimeter of the wall 32, a rectangular cover plate 33 located over the plate 38, and a downwardly extending, cylindrical positioning member support sleeve 40 received on the underside of the lower annular plate 34 at the perimeter of the aperture 36. The cluster tool 12 is secured to the wall 32 so that the wall 32, the plates 38 and 34 and the sleeve 40 are all stationary with the cluster tool 12. The vacuum containment vessel 20 also includes a slit valve 42 (shown best in FIG. 1B) within the circumferential wall 32 opposite the cluster tool 12, to enable accessing of the apparatus with a robot blade 16 located in the cluster tool 12.

The complete vacuum containment vessel 20 is preferably provided by using portions of the pressure chamber 22 as inner walls of the vacuum containment vessel 20 to define a vacuum region 50. To provide this configuration in the preferred embodiment of the invention, the pressure chamber 22 includes an upper body 44, which is received in and at least partially supported by the cover plate 33, to form the upper portion of the vacuum container 20. The upper portion of the pressure chamber also includes an upper plug 46, which is received over the upper body 44 and is suspended from and supported by the reaction frame 26 by a bolt 302. The lower body 62 and the lower plug 64 continue the lower portion of the vacuum containment. The lower plug 64, which is moveable with respect to the vacuum containment wall 32 as will be further described herein, extends across the aperture 36 in the lower plate 34 to provide for access of the positioning apparatus 24 with the pressure chamber 22. Preferably, the aperture 36 is surrounded by a downwardly extending, cylindrical sleeve 40, from which extends a bellows 250 which extends into sealing engagement with the lower plug 64. This provides for the sealing of the lower aperture 36.

The pressure chamber 22 includes the afore-mentioned upper body 44, over which the upper plug 46 is received, and the lower body 62 received over the afore-mentioned lower plug 64. The inner surfaces of the plugs 46, 64 and the bodies 44, 62, form the outer boundaries of the pressure chamber 22, within which a pressurizable cavity 70 is formed when the bodies 44, 62 and plugs 46, 64 are positioned as shown in FIG. 3. As is discussed below, the lower body 62 is supported by the lower plug 64 when the pressurization chamber 22 is depressurized (see FIGS. 4 and 11–14) and by a pressure force when the pressurization chamber 22 is pressurized (see FIGS. 3, 19 and 20).

Figure 4:
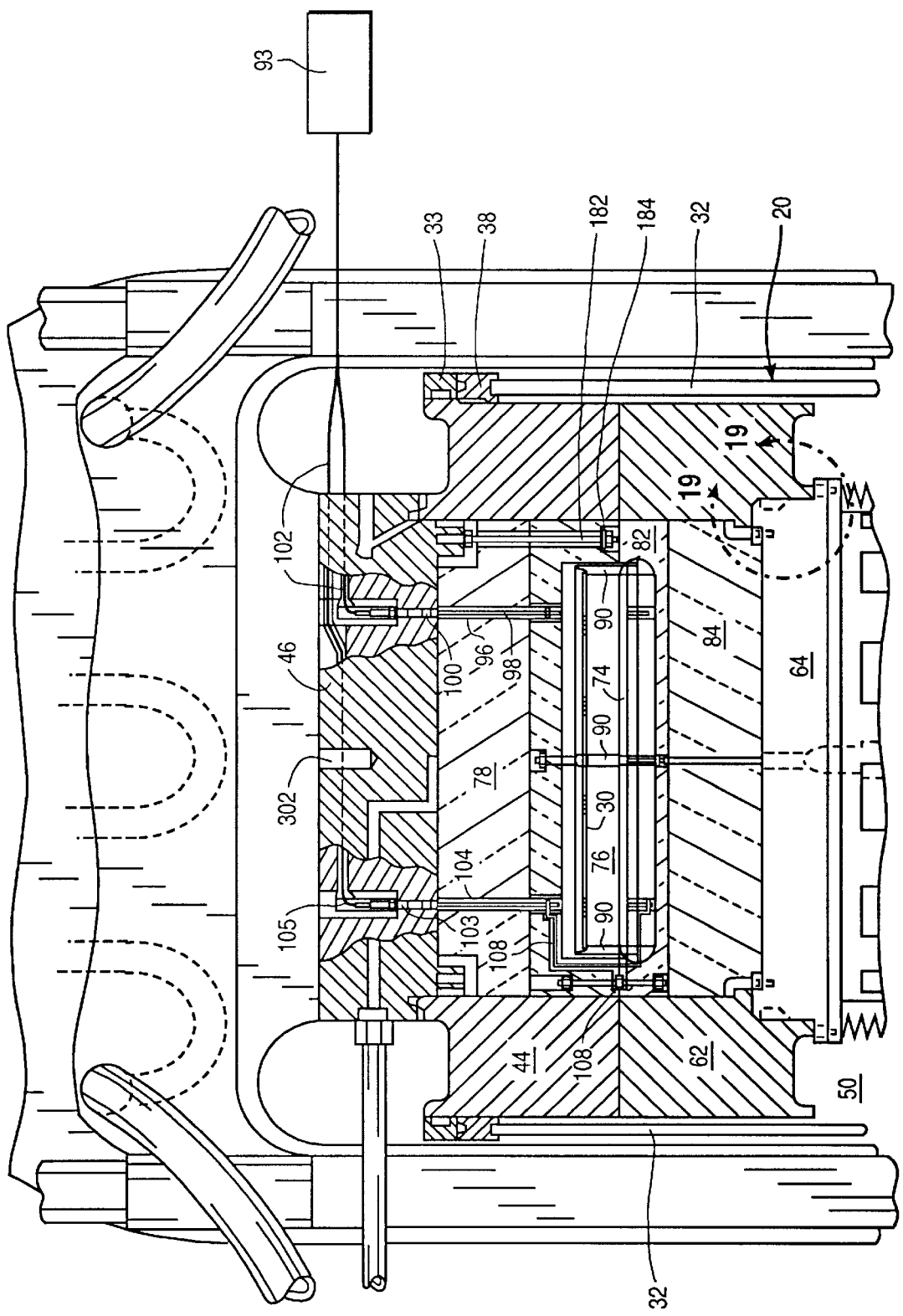
FIG. 4 is an enlarged sectional view of the chamber of FIG. 3 with the substrate chamber in a depressurized state.

The pressurizable cavity 70 defined within the chamber 22 is preferably configured to enable heating of the substrate 30 during the high pressure void filling step. In the preferred embodiment of the invention, an upper heater 72 and a lower heater 74, see FIG. 4, are positioned above and below a substrate receiving chamber or cavity 76 created within the pressurizable cavity 70. To form this substrate receiving chamber 76, to provide structural support for the heaters 72, 74, to thermally insulate the heated region of the chamber and to reduce volume of the pressurizable portion of the apparatus, an upper filler element 77 and a lower filler element 79 are located within the pressure chamber 70. Preferably, the upper filler element 77 is provided by upper filler plates 78, 80 which are bolted to the upper plug 46, and the lower filler element 79 is provided by lower filler plates 82, 84 which rest on a ledge 88 of the lower body 62. See FIG. 19. Each of the filler plates 78–82 is preferably manufactured from a refractory and insulating material, such as quartz, which exhibits minimal expansion at elevated process temperatures. The lowermost upper plate 80 and the uppermost lower plate 82 each include recesses 86, 87 therein which, when the filler plates 80, 82 are brought into proximity, form the boundaries of the substrate cavity 76. By configuring the filler elements 77, 79 from multiple plates 78–82, minimal thermal stresses will be induced within the plates 80, 82 as the apparatus is thermally cycled to process substrates. In particular, the uppermost upper plate 78 and lowermost lower plate 84 will be minimally thermally cycled but the lowermost upper plate 80 and uppermost lower plate 82 will be substantially thermally cycled, experiencing temperatures of between 20° and 500° C. By splitting the filler elements 77, 79 into multiple pieces, the plates 80, 82 can expand and contract at the contact region with the adjacent plate 78, 84, and large thermal stresses will be avoided in each of the plates 80, 82. Additionally, by providing the separation of the plates 78 and 80 and of plates 82 and 84 in a plane which is perpendicular to the circumferential faces of the bodies 44, 62, the loading of the plates 78 and 80 or 82 and 84 at the split lines therebetween, which will occur as the substrate cavity is pressurized, will occur substantially perpendicular to the contacting faces, and therefore minimal pressure induced side loading, and thus minimal pressure induced particle generation, will occur at the split line.

Upper and lower bodies 44, 62 resist the pressure force from within cavity 70 by virtue of their substantial hoop strength. Filler plates 78, 80, 82, 84 are surrounded by the pressurized environment of cavity 70 so they do not need to resist the high pressures created within cavity; rather it is upper and lower plugs 46, 64 which resist the vertical forces created by high pressures within cavity 70 by being forced against reaction frame 26 as is described below.

Referring still to FIG. 3, the substrate cavity 76 is formed within the filler plates 80, 82 and it includes a plurality of, preferably three, substrate support pins 90 (only two shown) which extend upwardly from the recess 86 in the uppermost lower filler plate 82 at the perimeter of the position of a substrate 30 when received in the substrate cavity 76. Each of the support pins 90 is a stationary member, which includes a chamfered upper face 92, see FIG. 4, which faces inwardly of the position of a substrate 30 in the chamber, and which terminates in a horizontal substrate support ledge 94. As the substrate 30 is positioned in the substrate cavity 76, the chamfered faces 92 of the pins 90 center the substrate 30 between the pins 90 as the substrate is deposited on the ledges 94 by the robot blade 16.

Referring now to FIGS. 3 and 4, the details of the connection of the heaters 72, 74 to a heater power supply 93 are shown. The heaters 72, 74 are each positioned to create an insulating gap of about 0.010 to 0.013 inch (0.25 to 0.33 mm) between the heaters and the fillers 80, 82. To connect the upper heater 72 to the power supply, a feedthrough arrangement 98 extends through a bore 96 provided therefor in the filler plates 78, 80, and terminates in a bore 100 in the upper plug 46. A lead 102 extends from the terminus of the feedthrough arrangement 98 in the plug 46 to the power supply 93. To connect the lower heater 74 to the power supply, a feedthrough arrangement 103 extends through an additional bore 104 provided therefor in the upper filler plates 78, 80 and terminates in the upper plug 46 at a lead 105, and below to a strap assembly 108 that extends from the terminus of the feedthrough arrangement 103 within the chamber and eventually to the lower heater 74 as described below. Referring now to FIGS. 4, 5 and 6, there is shown the details of the strap assembly 108. In the preferred embodiment of the invention, the strap assembly 108 includes an upper strap 112, which extends from the inner terminus of the feedthrough arrangement 103 to the lower terminus of the upper filler element 80, and a second strap which 114 extends from the heater 74 in the lower cavity and extends outwardly, and then upwardly, to the upper surface of the lower filler element 82. The straps 112, 114 join in opposed roll contacts 116, 118.

The roll contacts (best shown in FIGS. 5 and 6) are uniquely configured to enable relative motion between the straps, without causing rubbing contact between the straps 112, 114. In the most preferred implementation of the invention, as shown in FIG. 5, the roll contacts 116, 118 each include a central mounting portion 120, through which a stud extends to connect the roll contact 116 or 118 to the adjacent portion of the filler element 80 or 82 and the straps 112, 114. The dome-shaped contacts 122 on the lower roll contact 118 are contacted with the dome shaped contacts 122 of the upper roll contact 116 to create a circuit path between the lower heater element 74 and the heater power supply 93. The engagement of the dome shaped contacts 122 occurs at complementary points on the domes thereof, and, as the spacing between the straps 112, 114 changes, the central mounting portions 120 bend and the dome shaped contacts roll on one another to change the point of contact between the dome contacts 122. Additionally, the central mounting portions 120 have a free (i.e., unloaded) position, wherein the surface of the dome shaped contact 122 of the lower contact is the portion of the lower contact which extends furthest upwardly from the uppermost lower filler element 82, and the surface of the dome shaped contact 122 on the upper contact is the portion of the upper contact which extends furthest downwardly from lowermost upper filler element 80. Thus, as the pressure chamber 70 is closed after a substrate 30 has been loaded in the substrate cavity 70 thereof, the dome shaped contacts 122 provide the initial and continuing electrical contact between the straps 112, 114, and this contact is maintained on the dome shaped contacts 122 as the cavity 76 and chamber 70 are closed. This contact will be maintained at nearly point contact as the contacts engage and disengage. By creating and maintaining the electrical contact on the dome shaped contacts, and by changing the point of contact between the dome shaped contacts 122 by rolling the contacts 122 along the domed surfaces as the filler elements come together or are moved apart, particles will not be generated because the electrical contact is not created or maintained by rubbing contact between the contacts.

Figure 7:
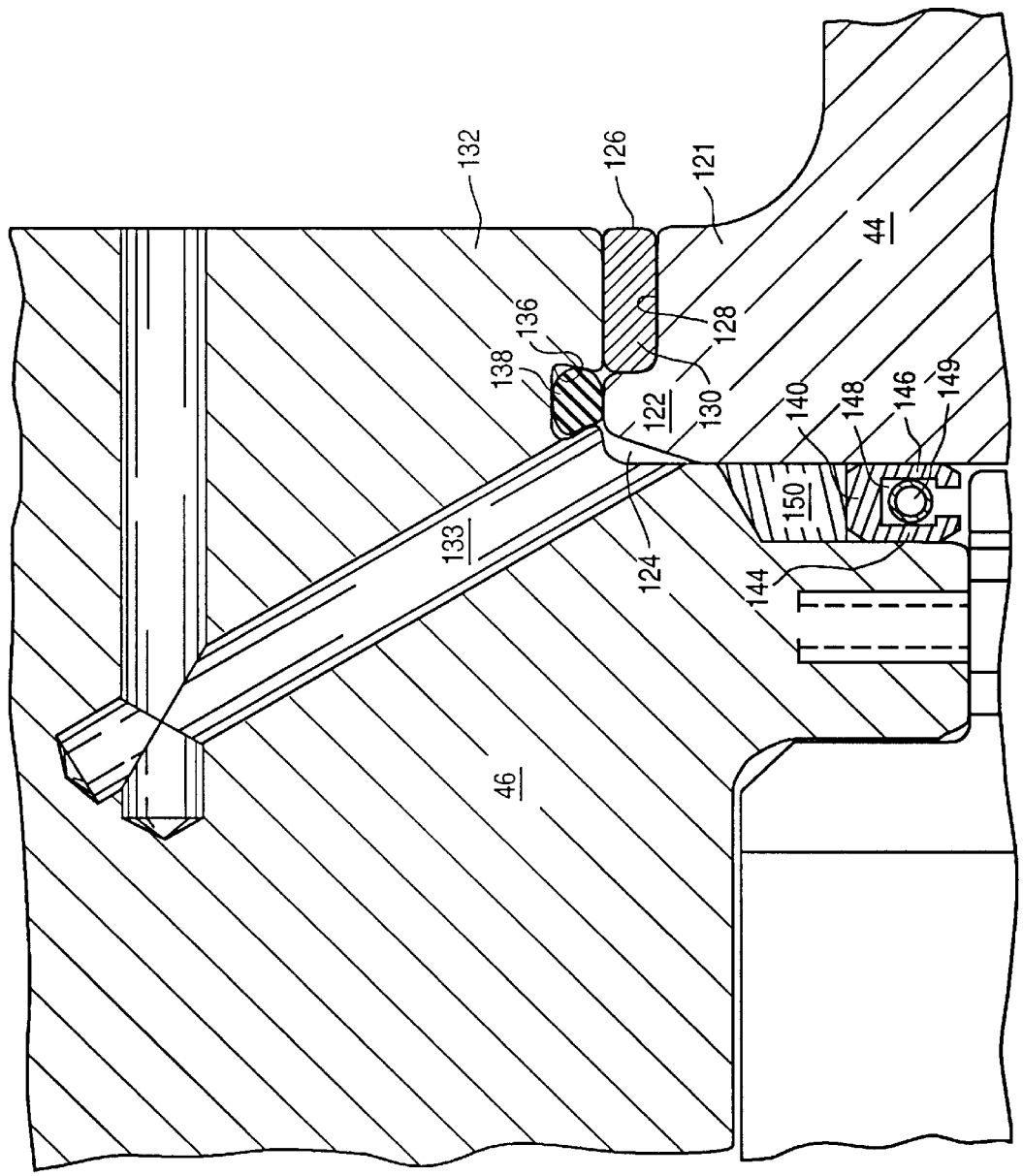
FIG. 7 is an enlarged view of a portion of FIG. 6, showing the connection of the upper plug and upper body.

Referring now to FIG. 7, the details of construction of the interconnection of the upper plug 46 and the upper body 44 are shown. Note that the upper plug 46 is mounted to and suspended from the reaction frame 26 and upper body 44 is supported by the vacuum containment vessel 20, which itself is mounted to and supported by cluster tool 12. The upper plug 46 and the upper body 44 are sized so that an appropriate contact force is generated between them at the intersection show in FIG. 7 when cavity 70 is pressurized. The body 44 includes an upwardly projecting inner annular shoulder 121, which also includes an upwardly extending seal flange 122 and a slip plate recess 126. The slip plate recess 126 includes an annular slip face 128, against which an annular slip plate 130 is received. The upper plug 46 includes an alignment shoulder 132, against which the inner annular shoulder 121 of the upper body 44 is received. The shoulder 132 includes an annular slip face 143, against which the upper surface of the slip plate 130 is received, and which also includes a dovetail seal recess or groove 136. The seal recess 136 is positioned over the annular seal flange 122, to enable sealing of an O-ring 138 received in the dovetail seal groove 136 against the seal flange 122.

The slip plate 130 provides low friction bearing surfaces to enable upper body 44 to move radially under a pressure load with respect to the upper plug 46, and it also provides a specific spacing between the upper plug 46 and the upper body 44 to ensure specific loading of the O-ring 138. Preferably, the slip plate 130 is manufactured from a material such as 316 stainless steel covered with a dry lubricant. Additionally, the seal flange 122 is positioned to engage the O-ring seal 138, but not contact adjacent surfaces of the upper plug 46. Thus, as the upper body expands and contracts, no particle generating contact occurs between the upper plug 46 and the upper body 44 adjacent the sealing surfaces or within the confines of the pressure cavity.

The placement of an O-ring in a dovetail groove may create a residual sealed region of air, which can leak into the chamber over time. Therefore, a vacuum passage 133 is ported to an annular passage 124 maintained between the inner face of the seal flange 122 and the dovetail seal groove 132, to exhaust any air that may be trapped in the groove.

The O-ring 138 permits a vacuum seal in the annular passage 124 to prevent passage of fluids or gases into the chamber. However, an O-ring typically creates gas solubility and decompression issue. Therefore, a second, primary, seal 140 is maintained between the interior face of the upper body 44 and the outer surface of the upper plug 46. This primary seal 140 is preferably a lip seal, having a pair of lips 144, 146 and a central recess 148, and a spring 149 located in the recess to outwardly bias the lips 144, 146. The spring 149 ensures that the lips 146, 148 are maintained in contact with the surfaces of the upper plug 46 and the upper body 44, to seal the pressure chamber 22. Additionally, a back-up body 150, preferably made of aluminium bronze, is maintained on the low pressure side of the seal 140, to ensure that the seal is not extruded from the region between the upper plug 46 and the upper body 44.

Figure 8:
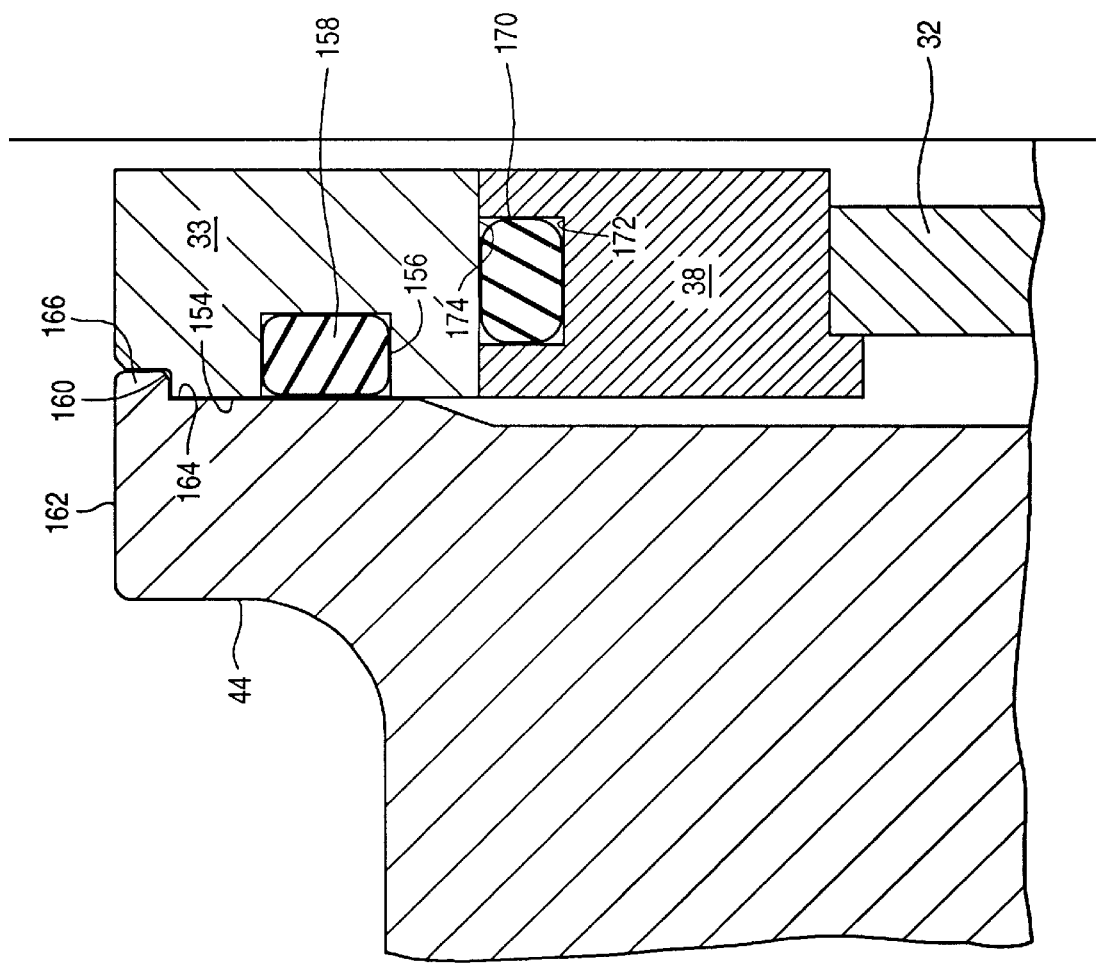
FIG. 8 is a detail view of the connection of the upper body to the vacuum containment wall.

Referring now to FIG. 8, the connection of the vacuum containment wall 32 and the upper body 44 is shown.

Preferably, the removable rectangular upper plate 33 includes an inner cylindrical face 154, within which is provided a seal recess 156 within which is located a seal 158, preferably an O-ring seal. The inner cylindrical face 154 terminates at the top of the plate 33 in a support recess 160. The upper body 44 includes an upwardly and outwardly extending shoulder or flange region 162, having an outer cylindrical face 164 which terminates, adjacent the upper end of the upper body 44, in an outwardly extending, annular support lip 166. The support lip 166 is received in the support recess 160, such that the weight of the upper body 44 may be suspended on the upper plate 33. Additionally, the seal 158 spans the gap between the upper plate 33 and the circumferential face 164 of the upper body 44, to provide the vacuum seal at the upper end of the vacuum region 25 of the vacuum containment vessel 20. The seal 158 also centers the ring 44 in plate 33 while allowing ring 44 room to expand and contract as the chamber is pressurized, without constraint by the plate 33.

The upper plate 33 rests on and is bolted to the plate 38 at the upper end of the vacuum containment wall 32. To seal this connection, an O-ring 170 is received in an O-ring groove 172 in the upper surface of the plate 38, and this seal seals against the lower surface 174 of the upper plate 33. The O-rings 132, 158, 170 are all preferably made of a fluoroelastomer such as Viton® or a Buna rubber material. The plate 38 is welded to the upper end of the wall 32 has an inner circumferential wall 168 which defines a rectangular opening.

Once the upper plug 46, the upper body 44 and the upper plate 33 have been removed, the large rectangular opening in the wall 32 provides unimpeded user access to the remainder of the parts of the apparatus 10.

Referring again to FIGS. 3 and 4, the connection of the upper filler elements 78, 80 to the upper plug 46 is shown. In the preferred embodiment of the invention, the pressure chamber 22 is configured such that the substrate receiving chamber 76 is aligned with the chamber slit valve 42. When valve 46 is opened, the lower filler elements 82, 84 and the lower plug 64 move downwardly away from the upper plug 46. Therefore, to allow a gap to be created for placement and removal of substrates from the substrate cavity 76, the upper filler elements 78, 80 must be suspended from the upper plug 46. This suspension connection must allow relative movement between the filler elements 78, 80 and the upper plug 46, because different thermal loads and coefficients of thermal expansion, and thus different rates of thermal expansion, may be present as between the upper plug 46 and the filler elements 78, 80. Therefore, a plurality of clearance bores 180 (only one shown) extend through the filler elements 78, 80, and a tie rod or stud 182 extends through each bore 180 and is received in a threaded bore in the upper plug 46. To enable thermal expansion between the filler elements 78, 80, and between the elements 78, 80 and the upper plug 46, a plurality of belleville spring-type washers 184 are received between a nut received over the end of the stud 182 and the underside of the lowermost of the upper filler plate 80. The belleville springs 184 enable maintenance of the filler plates 78, 80 on the upper plug 46, while enabling relative movement between the lower surface of the lowermost filler plate 80 without inducing excessive stress in the filler plates 78, 80. Additionally, the belleville springs 184 substantially seal the bores 180, to limit the creation of a circulating convective path through the bores 180.

Figure 9:
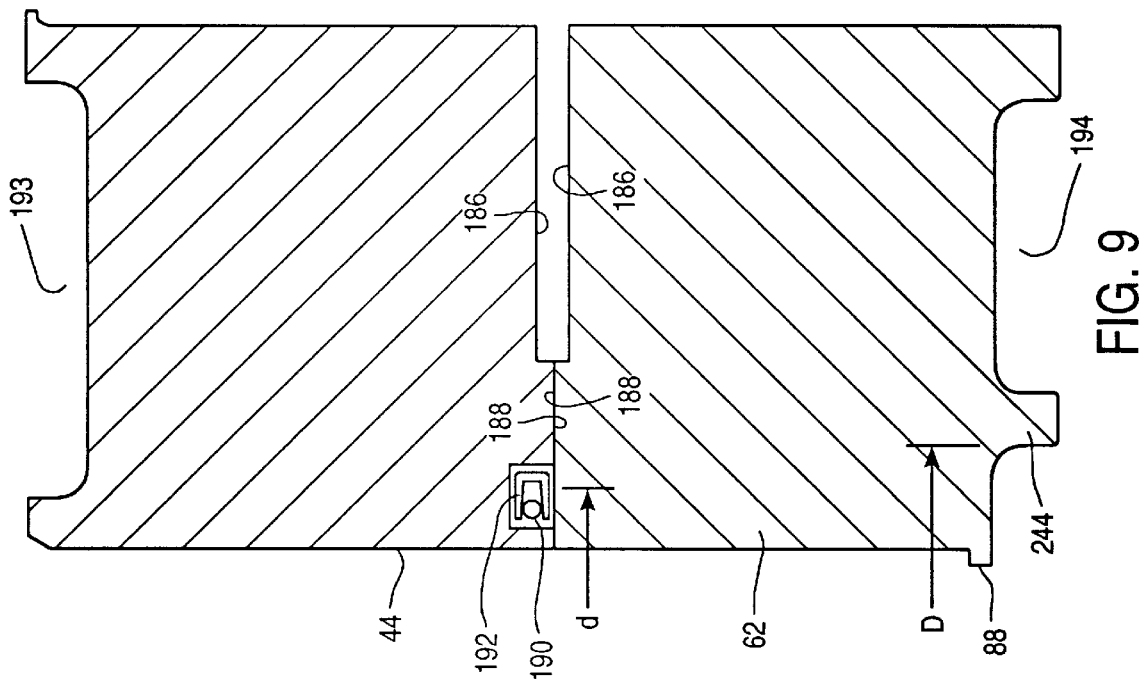
FIG. 9 is a detail view of the closed, or substrate-cavity-forming, position of the two bodies.

Referring now to FIG. 9, the connection of the upper and lower bodies 44, 62 is shown. Preferably, each of the bodies 44, 62 has an annular face 186, at the inner portion of which is an extending, raised portion 188. The lower inner face 188 of the upper body 44 includes a seal groove 190 therein, within which is retained a lip seal 192. The lip seal seals against the raised portion 188 of the lower body 62 when the bodies are brought into engagement when the chamber is closed as shown in FIG. 3.

Preferably, the bodies 44, 62 will expand and contract equally under the heat and pressure cycling of the chamber. This is enabled by providing the upper and lower bodies 44, 62 carefully developed by finite element analysis, which is well within the scope of one skilled in the art for any combination of pressure ranges, thermal loads and materials. Preferably, the bodies are designed to have minimal bowing, or differential expansion in the radial direction, which prevents the bodies from coming into particle forming engagement. Therefore, as the bodies 44, 62 expand and contract when the pressurizable cavity 20 is pressurized and depressurized, contacting surfaces 188 move in unison and therefore do not slide over one another. As can be seen with reference to FIG. 9, upper and lower bodies 44, 62 are designed to have similar cross-sectional shapes, with each having an open annular recess 193, 194 formed in their outer ends which tend to structurally balance the cross section.

Figure 10:
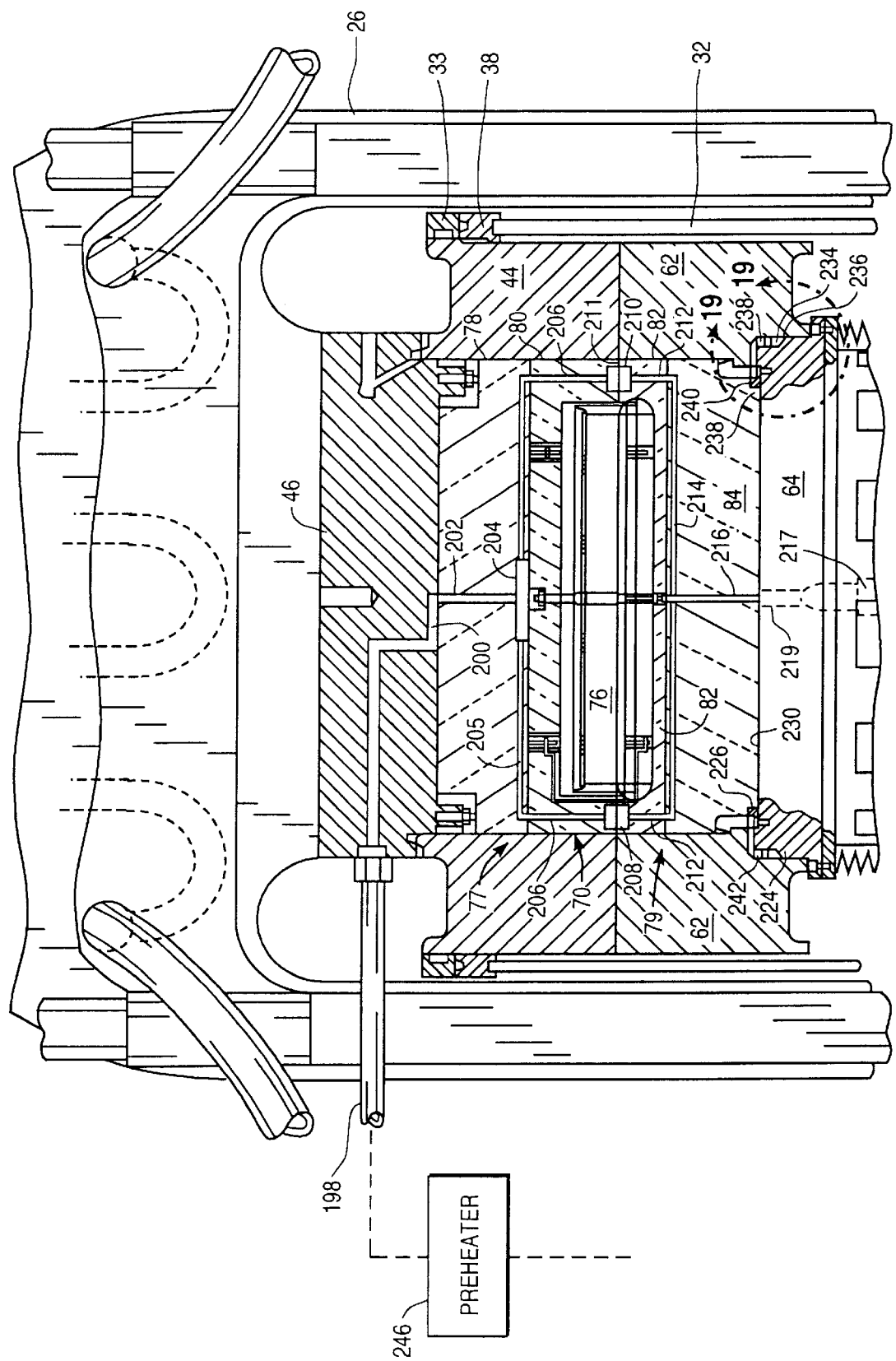
FIG. 10 is an enlarged view of the pressure chamber components of the apparatus shown with the substrate chamber in a depressurized state.

Referring now to FIG. 10, the details of the feed system for supplying the pressurizing gas to the pressure chamber 70 is shown. In this preferred embodiment of the invention, the gas feed is supplied through a high pressure line 198 and then through a feed passage 200 in the upper plug 46, which communicates with a central passage 202 extending vertically through the uppermost filler element 78. This central passage 202 terminates, at the interface of the two upper filler elements 78, 80, in a cylindrical manifold 204 formed as slight recess in one of the filler elements 78, 80. An extended thin, generally annular manifold 205 extends from the perimeter of the manifold 204 and connects with a plurality of individual, axially-extending feed bores 206 extending through the lowermost of the upper filler elements 80. The bores 206 terminate in an upper circumferential manifold 208 which extends into the lower surface of the lowermost of the upper filler plates 80. The plurality of feed bores 206 supply the gas into the manifold 208, where it is evenly distributed at the interface 211 of the filler elements 77, 79. The gas is thereby consolidated into a blanket of slow-moving gas which enters the substrate cavity 76 at an even pressure and reduced velocity flow about the circumference of the substrate 30; this reduces the likelihood that a substrate may become dislodged from the support pins 90 by the movement of the gas into the substrate cavity 76 and also reduces the likelihood that particles will be stirred up by the flow of gas into the chamber 22.

The upper circumferential manifold 208 also supplies the pressurizing gas to the region between the lower plug 64 and the lower filler elements 82, 84 and the lower body 62, and to the gaps between the rings 44 and 62 and between each of the filler plates 78-84. To provide this feature, a lower circumferential manifold slot 210 extends into the uppermost of the lower filler plates 82. A plurality of axially-extending lower feed passages 212 extend vertically therefrom to a manifold 214 formed in the space between the lower filler elements 82, 84. Manifold 214 fluidly couples the lower ends of the passages 212 to a lower feed bore 216. The feed bore 216 extends from the approximate center of the two lower feed plates 82, 84, and into the region or gap 218 (shown best in FIG. 19) between the lowermost filler plate 84 and the lower plug 64 to supply the pressurizing gas to that region of the apparatus.

The interior of the pressurizable cavity 70 is exhausted using a roughing pump (not shown) coupled to line 198 (see FIGS. 1A and 1B) by a valve (not shown) and a turbomolecular pump 248 mounted to the circumferential wall 32 in the vessel 20 covering an opening 221 formed in the wall 32. Additionally, a relief bore 219 may be extended through the lower plug 64, and into communication with a valved exhaust bore 217 extending outwardly of the apparatus. The use of the relief bore 219 enables the complete flushing of the substrate receiving cavity 76 with gas, by porting gas into the chamber through the afore-described inlets, and simultaneously exhausting the gas through the exhaust bore 217.

In the preferred embodiment of the invention, the gas supplied to the pressure chamber 70 is preheated before entering the feed passage 200. The preheating is provided by a pre-heater 246, shown schematically in FIG. 10, which is controlled by a closed loop system controller. To determine the desired input temperature of the gas into the feed passage, a thermocouple (not shown) is maintained on one of the bodies 44, 62. The output of this thermocouple, which corresponds to the stable operating temperature of the body 44 or 62, is read by the controller, and a signal is outputted from the controller to change the heater temperature to adjust the incoming gas temperature to the temperature of the bodies 44, 62. By doing so, the gas will not be a heat load on the bodies 44, 62, and cycle times of the apparatus will be decreased by reducing the heating required of the internal heaters 72, 74. Alternatively, the gas may be heated to a predicted pre-heat temperature, which is based upon the expected, steady state temperature of a component of the apparatus, such as the bodies, so a thermocouple and closed loop controller would not be used.

Figure 19:
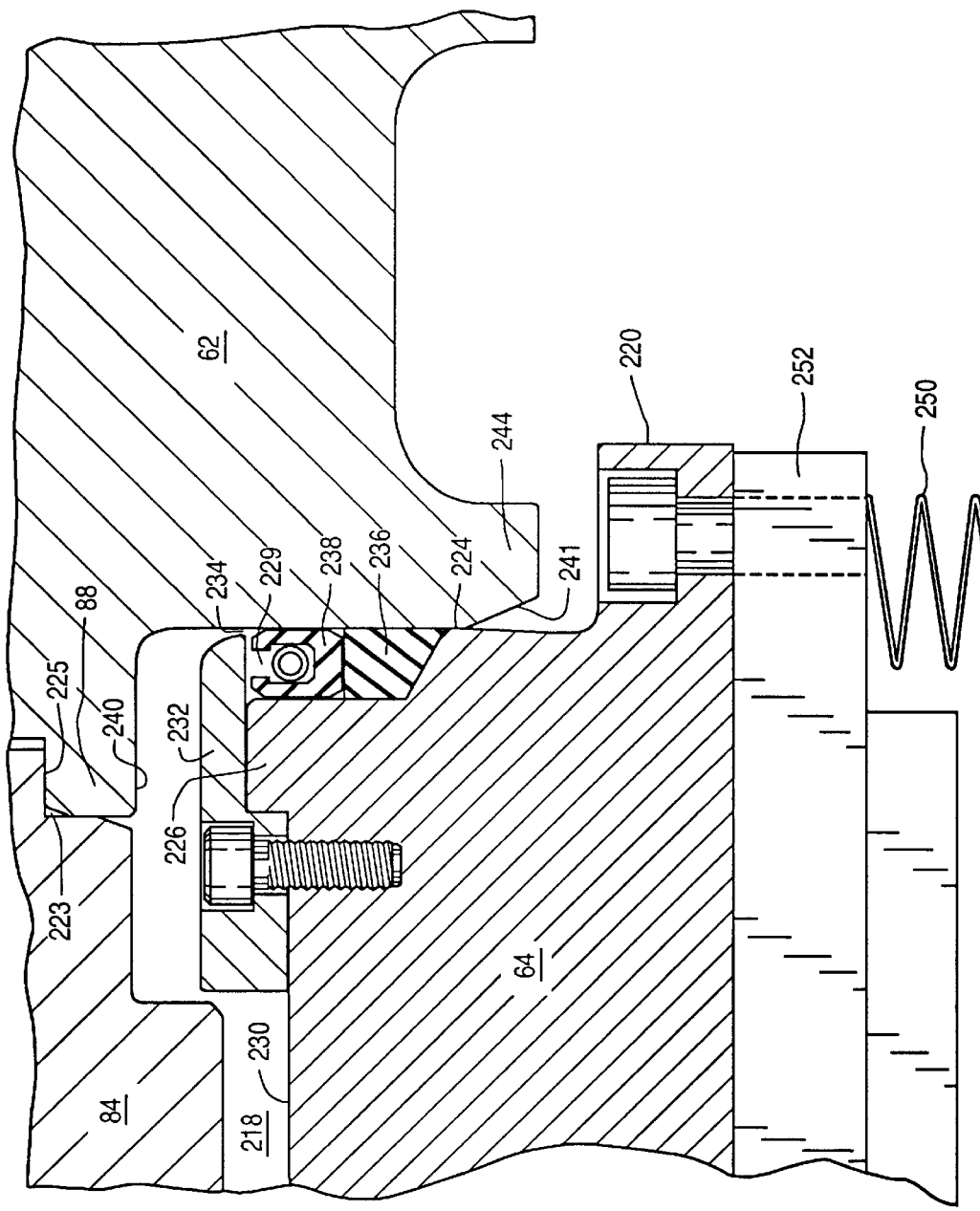
FIG. 19 is an enlarged view of the sealing region between the lower body and the lower plug of FIG. 3.

Referring still to FIGS. 10 and 19, the positioning of the filler elements 82, 84 on the lower body 62 is shown. The filler element 82 rests on and is supported by the filler element 84. The filler element 84 has a cut-out region 223 which provides an annular surface 225 which rests against and is supported by the ledge 88 of the lower body 62.

The lower plug 64 is a cylindrical member, having an outwardly extending support flange 220, an upwardly extending, outer circumferential face 224 and an upwardly extending ridge region 226 extending upwardly from the generally planar upper surface 230 thereof. In the preferred embodiment of the invention, the outer face 224 of the plug 64 includes a seal recess 229 therein, over which an annular body 232 projects. A backup ring 236 and a lip seal 238 may be located in the seal recess 229 and locked into position by the annular body 232. As can be seen in FIG. 19, the annular body 232 is bolted to the upper surface 230 and is sized to provide a small gap 234 opposite the lower body 62. This permits high pressure gas to enter the seal recess 229 and cause the lip seal 238 to seal the recess 229; it also helps to trap any particles which might be created by the relative axial movement of the lower plug 64 and the lower body 62.

When the pressurization chamber 22 is depressurized, as in FIGS. 11–14, an inner circular flange 244 of lower body 62 rests on the support flange 220 of lower plug 64 (as shown in FIG. 3). At these times the lower plug is usually supported by a pneumatically-actuated positioning rod or shaft 272, discussed below. When the pressurization chamber 22 is pressurized, as in FIG. 3, the pressure on a lower face 240 of the lower body 62 below the ledge 88 is sufficient to keep lower body 62 forced upwardly against the upper body 44. This is because the maximum circumferential dimension D (see FIG. 9) of the surface 240 is greater than the maximum circumferential dimension d over which high pressure is exerted against the lower body 62 at the lip seal 192. This creates a net upward force on the lower body 62 sufficient to counteract the weight of the lower body 62 and keep the lip seal 192 properly sealing the lower and upper bodies 44, 62. The flange 244 the lower body 62 includes a chamfered face 241. This helps to ensure that the inner face of the lower body 62 does not bind on the outer face of the plug 64 in the event that the lower body 62 becomes tipped slightly during processing.

Figure 20:
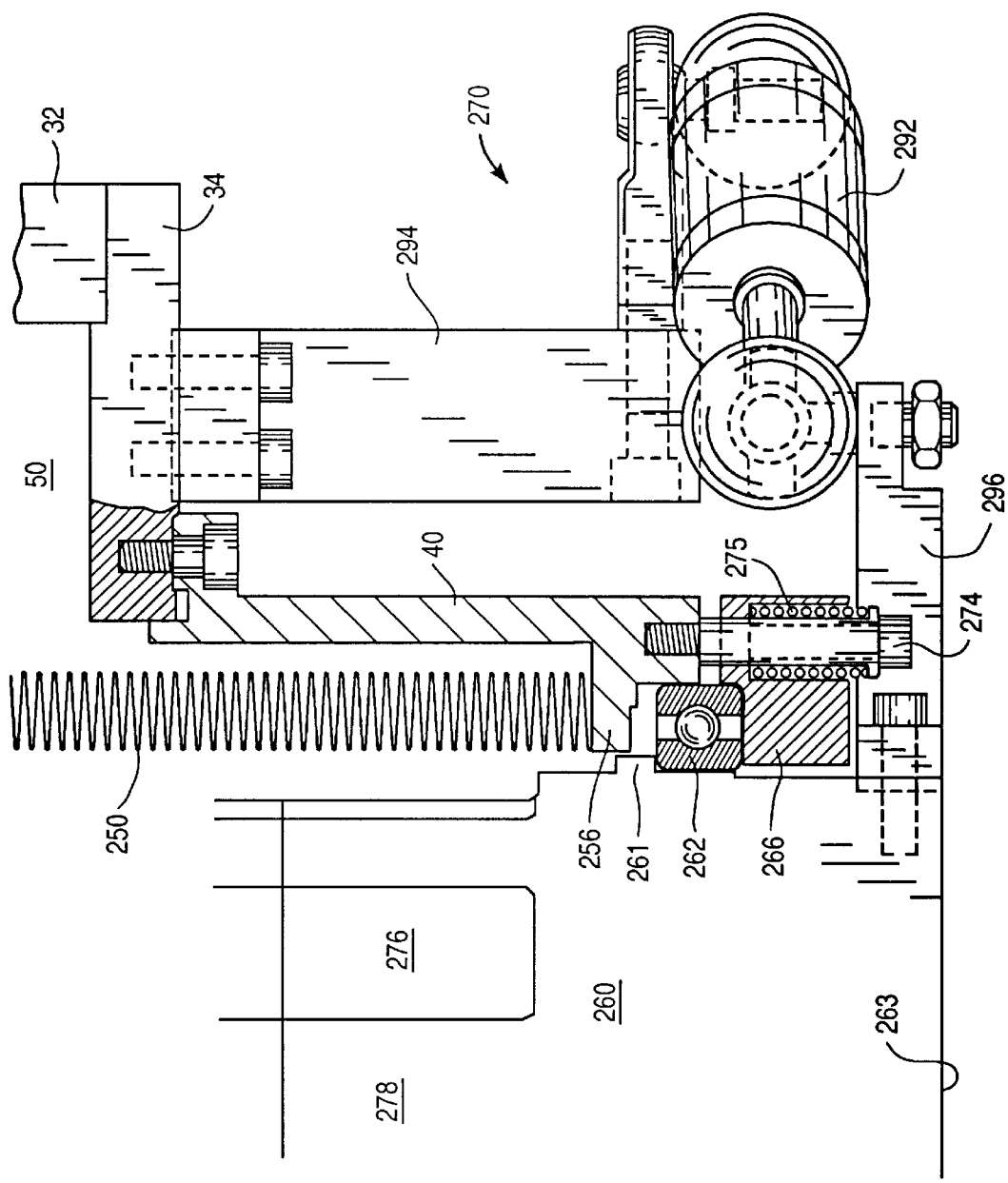
FIG. 20 is an enlarged view of the region surrounding the lower finger plate positioning member of FIG. 3.

Part of the lower plug 64 in the region of the support flange 220 defines part of the vacuum region 50. Referring to FIGS. 3, 19 and 20, to ensure vacuum conditions, bellows 250 extends from an adaptor flange 252 secured to the support flange 252 about its perimeter, and terminates on an inwardly projecting ledge 256 of the support sleeve 40.

To operate the apparatus 10, the pressure chamber 70 must be openable to permit removal and replacement of a substrate 30 on the pins 90, and closeable to reposition the pressure chamber elements, in the preferred embodiment the lower filler elements 82, 84, the lower body 62 and the lower plug 64, to recreate the pressure chamber 70 and cavity 76 after a new substrate 30 has been placed therein. Preferably, the positioning of the chamber elements to reform the pressure chamber 70 and cavity 76 should provide physically grounded positioning of the parts, i.e., the connection of the plugs and bodies to the reaction frame 26 should be one of load bearing physical contact, that is a hard physical connection, rather than relying on, for example, hydraulic positioning. Hydraulic positioning always faces potential leaks and then loss of an effective closure. The positioning assembly 24 of the present invention, see FIG. 1B, in combination with the reaction frame 26, uniquely provides this feature.

Figures 15, 16:
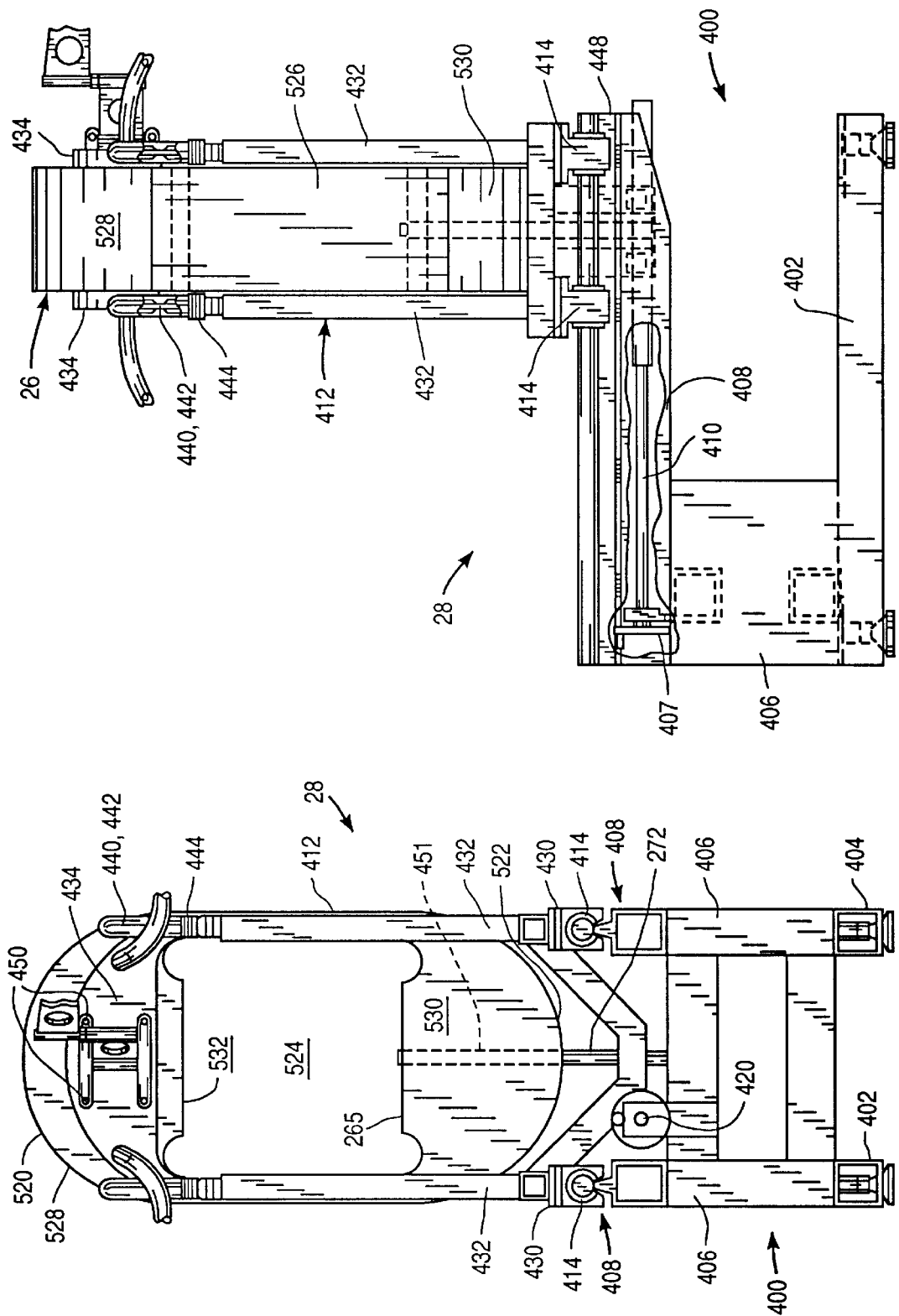
FIG. 15 is an end view of the reaction frame and carriage.
FIG. 16 is a side view of the reaction frame and carriage.

Referring still to FIGS. 1B, 2B, 3, 19 and 20, the positioning assembly 24 includes a finger plate assembly 48, having a lower finger plate 260 which is connected, through a bearing 262 received in a spring-supported race support 266 on the lower end of the sleeve 40, to the sleeve 40, an upper finger plate 268 which is preferably formed as a contiguous extension of the lower plug 64, a lower finger plate positioning member or actuator 270 and an upper finger plate positioning shaft or rod 272 (FIG. 15). The lower finger plate 260 also includes a lower planar face 263, which is positionable over a planar load face 265 in the reaction frame 26. Preferably, the lower finger plate 260 is coupled to the sleeve 40 by positioning member 270, in a manner to ensure proper relative movement between the upper and lower finger plates 260, 268. To provide this, the lower finger plate 260 includes a flange 261, which is received over the inner race of a bearing 262, and the outer race of the bearing 262 is received on the race support 266, support 266 being secured to the underside of the sleeve 40 through the use of, in the preferred embodiment, sixteen spring support bolts 274 and springs 275 (FIG. 20).

The springs 275 exert an upward force on the race support 266 which, in turn, exerts on upward force on the lower finger plate 260 through the bearing 262. The springs 275 also exert a downward force on the spring support bolts 274. The bolts 274 are fastened to, and thus are stationary with respect to, the support sleeve 40. When the pressure chamber 22 is pressurized, the springs 275 are completely compressed, as in FIG. 20. When the pressure chamber 22 is depressurized, or at least at a lower pressure, the use of the spring 275 and the bolts 274 enables movement of the finger plate 260 with respect to the bolts 274 and thus with respect to the support sleeve 40.

When the pressurization chamber 22 is not pressurized, the force of the springs 275 is sufficient to raise the finger plates 260, 268 upwardly to create a gap 282 (FIGS. 11–13) between the face 263 of the finger plate 260 and the face 265 of the reaction frame 26. This permits relatively easy rotation of the lower finger plate 260 when the chamber 22 is depressurized because the lower finger plate 260 is not in contact with the reaction frame 26 at this position. FIG. 20 illustrates the relative positions of the bearing 262 and the ledge 256 when the pressurization chamber 22 is pressurized.

The finger plates 262, 268 provide a hard physical connection between the reaction frame 26 and the plugs 46, 64 during pressurization of the chamber 70, but also enable separation of the bodies 44, 62 by allowing the lower body 62 to retract from the upper body 44 which is supported by the vacuum containment wall 32 through the connection thereof with the cover plate 33. To enable this separation, each of the finger plates 260, 268 includes a plurality of radial segment slots 276 and radial segment ledges 278. The plates 260, 268 may be vertically manipulated during non-pressurized states of the apparatus 10 when the slots are aligned with opposite recesses. As shown in FIG. 3, when the ledges are aligned, i.e., the outermost planar surfaces of the ledges 278 are contacted, the bodies 44, 62 are rammed together by the lower plug 64, which is rigidly connected to the reaction frame 26. The rigid connection occurs because the pressure chamber 70 when pressurized, tends to push the lower plug 64 downwardly with respect to the upper plug 46. The resistance to the movement by the spring support bolts 274 is overcome by compressing the springs thereof; the resistance to this movement by the shaft 272 is overcome since the shaft 272 is driven up through the middle of the reaction frame 26 by air cylinders 254 located on either side of the reaction frame 26. The air cylinders 254 are overridden by the much greater force exerted by pressurization of the chamber 22. The movement of the lower plug 46 is limited because as the plug 46 moves, its fingers engage the lower finger plate 260 which in turn engages the load face 265 of the reaction frame 26.

Figure 21:
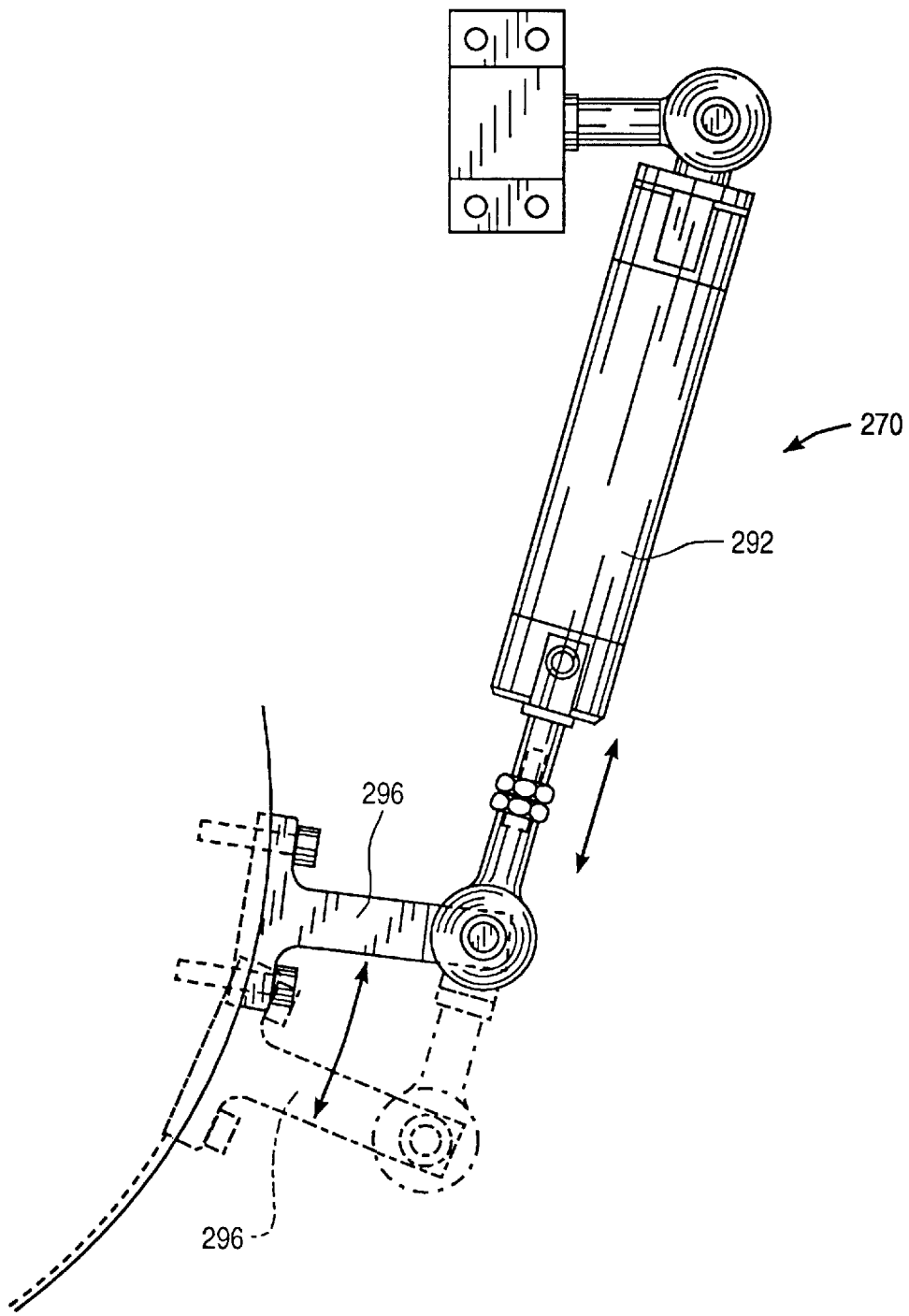
FIG. 21 is a plan view of the lower finger plate positioning apparatus of FIG. 3.

To open the pressure chamber 22 and the cavity 76, the pressure in the chamber 70 is evacuated to a pressure on the order of $10^{-2}$ to $10^{-3}$ torr with the roughing pump 248 through the opening 221 in the wall 32 and the exhaust bore 217. This causes the lower plug 64 to move towards the substrate cavity 76, because the underside thereof is exposed to atmosphere. This movement enables separation between the finger plates 260, 268. Additionally, as the lower plug 64, and thus the upper finger plate 268 which is an extension of the lower plug 64, lifts into the chamber 70, it lifts completely away from the lower finger plate 260 which allows the spring support bolts 274 to lift the lower finger plate 260 off the reaction frame load face 265. Because, in the evacuated state, the finger plates 260, 268 are separated, and the lower finger plate 260 and the load face 265 are separated, the relative positions of the finger plates 260, 268 may be easily changed using the actuator 270 (FIGS. 20, 21).

Preferably, the actuator 270 includes a pneumatic cylinder 292. Operating the pneumatic cylinder 292 moves the lower finger plate 260 between a first position wherein the fingers of the finger plates 260, 268 are aligned end to end, and a second position wherein the fingers of each of the finger plates 260, 268 are aligned with the recesses of the other of the finger plates 260, 268. Although other actuation systems, such as worm drives, rotary actuators, or other devices may be used, a simple linear actuator with positive stops at the finger to finger alignment and finger to recess alignment positions of the two finger plates, ensures proper positioning of the two finger plates.

The positioning of heaters 72, 74 above and below the substrate 30 when the substrate cavity 76 is fully closed enables precise, uniform, control of the substrate temperature during processing. The lower heater provides heat into the pressurizing gas, which uniformly heats the underside of the substrate. The upper heater 72 then serves in part as a heat source and in part as a guard heater, to maintain the temperature of the gas above the substrate 30 above that maintained in the gas below the substrate. Doing so provides a thermally stable stratification of gas temperature in the cavity, which reduces the likelihood that thermal-differential-induced flows occur in the pressurized gas in the substrate cavity 76. Without the upper heater, the gas would flow in a toroidal or other circular pattern, because the gas present at the top of the cavity would be cooler than that at the bottom of the cavity. Because cooler gas falls (and warmer gas rises), convection of cooler gas downward from the region above the substrate to the region below the substrate will create non-uniform temperatures across the substrate and may stir up particles.

It may not be necessary to use the lower heater 74; the upper heater 72 may be sufficient. It is expected that use of the upper heater 74 will continue to help prevent convection currents within the cavity. Also, it is desirable to position the upper heater 74 close to, preferably within 0.060 inch (1.5 mm) of the substrate 30 for maximum effectiveness.

Figure 11:
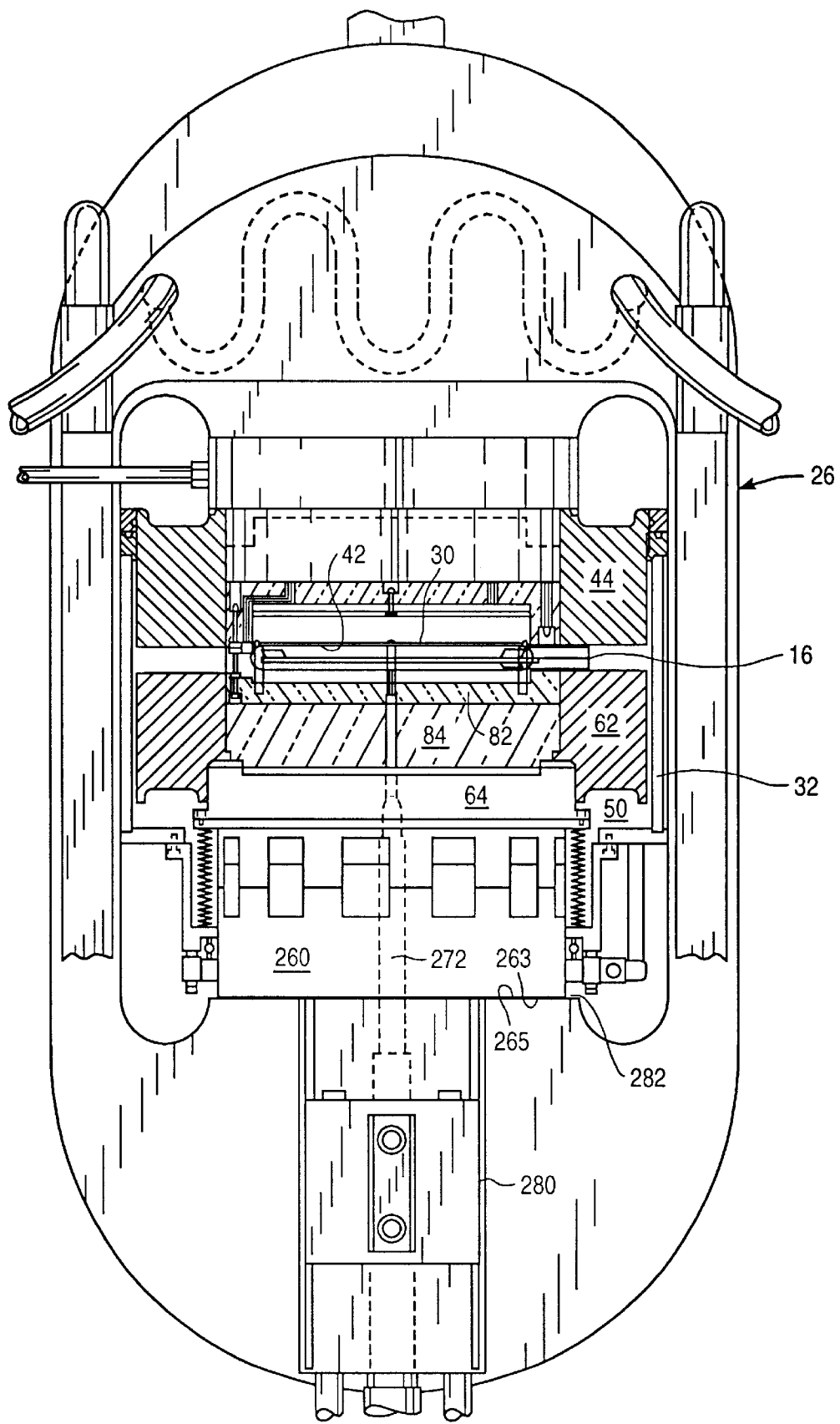
FIG. 11 is a sectional view of the apparatus of FIG. 3, with the substrate chamber in a depressurized state and showing the apparatus opened for robot access.

Referring now to FIGS. 3 and 10 to 13, the sequence of operation of the apparatus 10 is shown. Referring first to FIG. 3, the apparatus 10 is positioned for high pressure filling of the holes under the film layer on the substrate 30. Once the filling process is completed, the pressurizing gas is vented from the chamber through passage 200 and line 198 after which the cavity 70 is evacuated by switching the main gas feed line, normally connected to feed passage 200, to a vacuum sink which leads to the roughing pump (not shown). This can be accomplished through the bores 219, 217 if desired. Once the pressure chamber pressure is reduced to approximately $10^{-2}$ to $10^{-3}$ torr, the air cylinders 280 below the lower plug 64 allow the lower plug to move upwardly, by virtue of the atmospheric to vacuum pressure differential, to provide a small clearance between the two finger plates 260, 268. Note that when the pressure in the substrate cavity is relieved, the lower plug 64 is easily rammed fully upwardly against the underside of the lower body 62 as shown in FIG. 11

Once clearance is provided between the finger plates 260, 262 and with the reaction frame, the actuator 270 may easily rotate the finger plates 260, 268 to align the recesses 276 with the ledges 278. The shaft 272 is then pulled downwardly by the air cylinders 280 to position the ledges 278 into corresponding recesses 276, and thereby lower ring 62 and the uppermost surface of the uppermost lower filler member 82 co-planar with the lower surface of the slit valve 42; see FIGS. 1 and 11. Note that the substrate 30 supported by the pins 90 is still above the uppermost surface of the slit valve 42. Thus, the robot blade 16 may enter through the slit valve 42 and be positioned below the substrate 30 positioned on the pins 90 as shown in FIG. 11.

Figure 13:
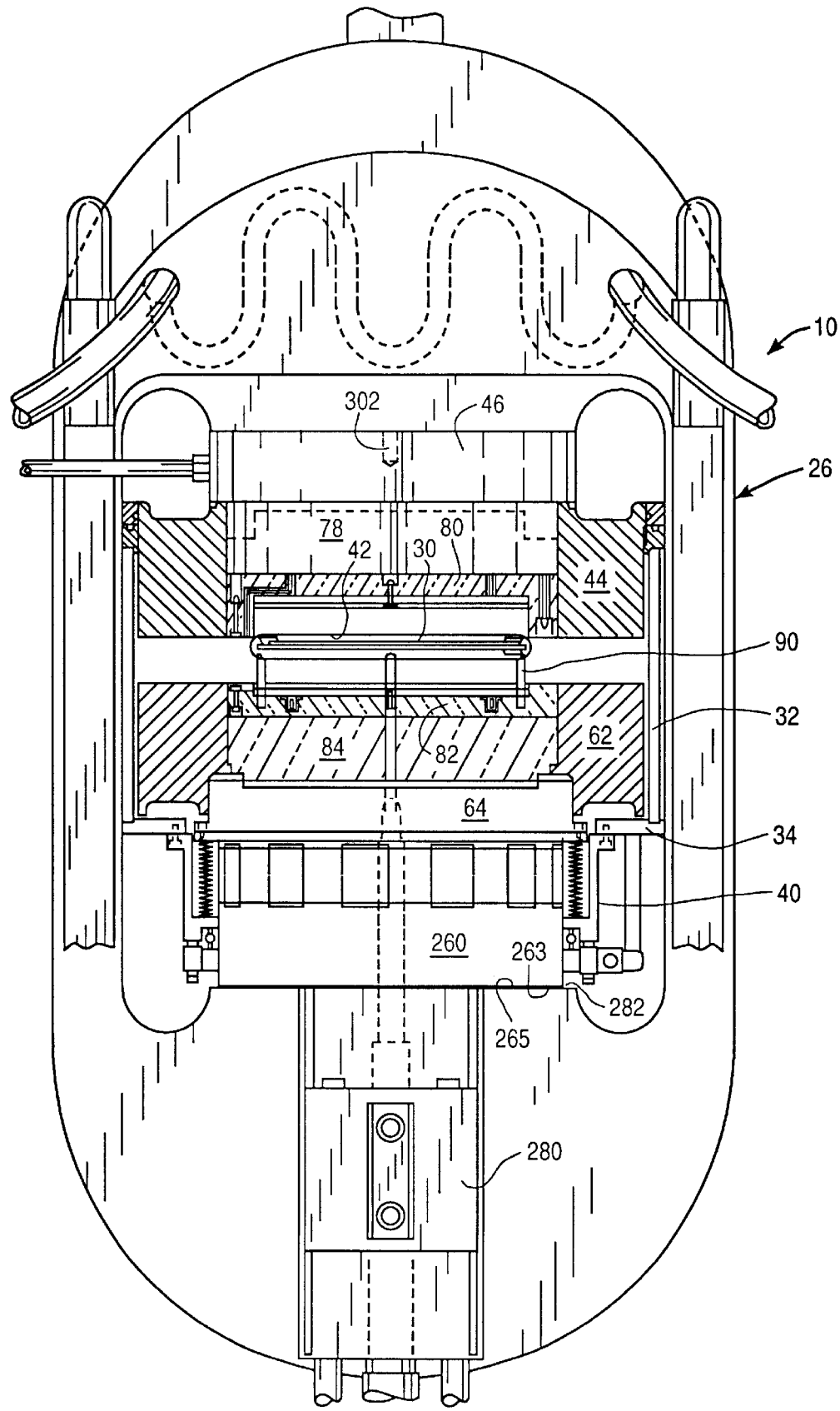
FIG. 13 is a sectional view of the apparatus of FIG. 12, showing the positioning member positioned to locate a substrate above the robot blade to enable entry of the robot blade into, and removal of the robot blade from, the pressure chamber.

To replace the substrate 30, the lower plug 64 is further lowered to the position shown in FIG. 13 while the blade 16 is maintained in a position below the substrate 30, which deposits the substrate 30 on the blade 16. The blade 16 retracts from the apparatus 10 and into the transfer chamber, and reenters the apparatus 10 with a new substrate 30. The blade 16 positions the substrate 30 over the pins 90, and the lower plug is moved, from the position of FIG. 13 to the position of FIG. 11, to reposition the substrate on the pins 90.

Figure 12:
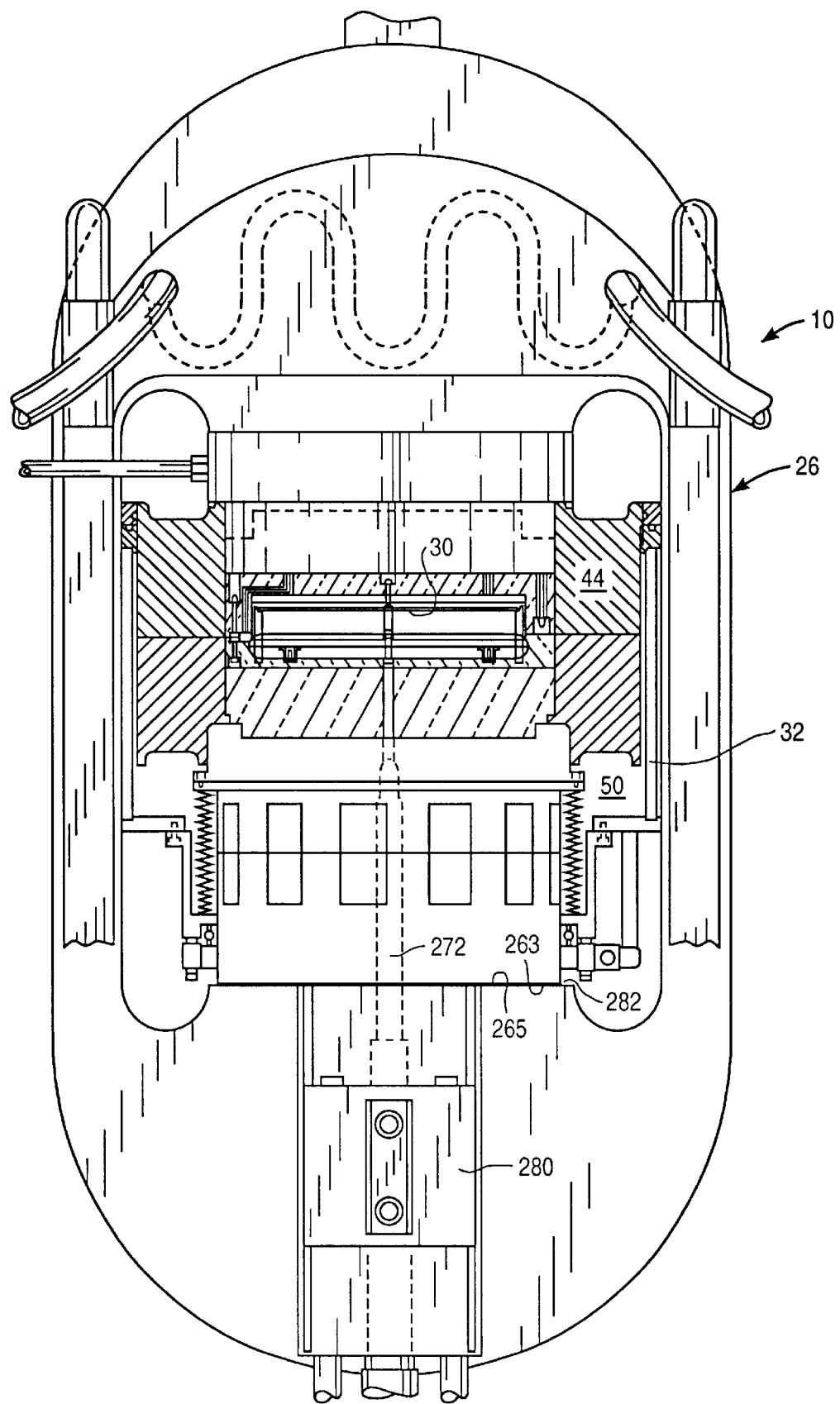
FIG. 12 is a sectional view of the apparatus of FIG. 3, showing the positioning member raised but the pressure chamber in the depressurized state enabling relative rotation of the finger plates.

The robot blade 16 is then removed into the transfer chamber, and the lower plug 64 is fully rammed upwardly to the position shown in FIG. 12. The lower finger plate is again rotated to align the ledges 278, and pressurized gas is again reintroduced to pressurize the pressure chamber to a pressure on the order of 8000 to 10,000 p.s.i. Doing so eliminates the gap 262 of FIGS. 11–14 and returns the apparatus to the condition of FIG. 3.

Figure 14:
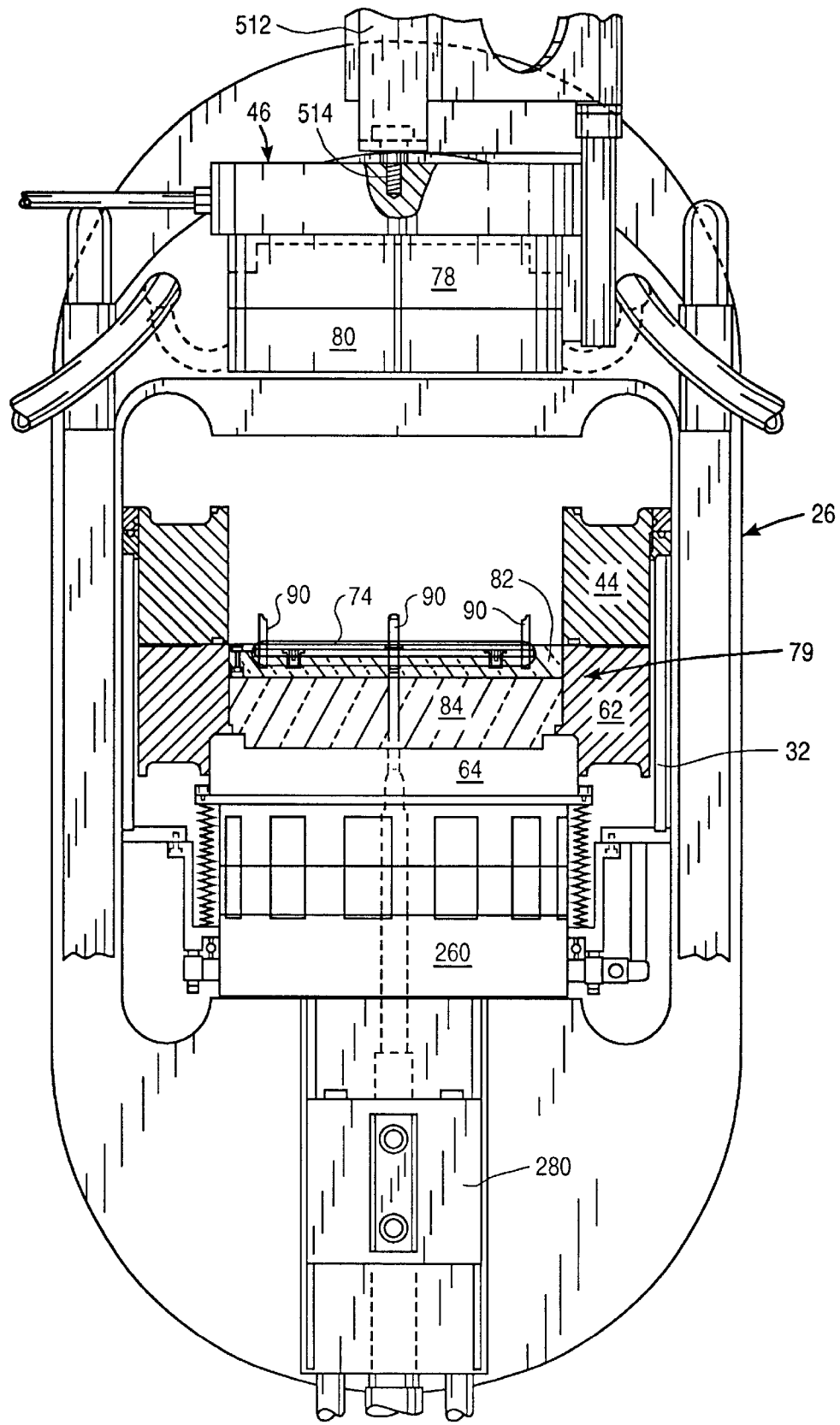
FIG. 14 is a sectional view of the apparatus of FIG. 12, showing the apparatus with the upper plug removed for service access.

During the operation of the apparatus 10, there will arise a need to open the apparatus 10, either for inspection, servicing or maintenance. The structure of the apparatus uniquely facilitates relatively fast opening and reclosing of the apparatus. Referring now to FIGS. 3 and 14, the opening of the apparatus is shown. To open the apparatus, the bolt 302 (FIG. 3) connecting the reaction frame 26 to the upper plug 46 is removed. Because the reaction frame 26 is spring biased upwardly on the carriage 28 (see FIGS. 1 and 2) by about 25 pounds (force), the removal of the bolt 302 allows the reaction frame 26 to move upwardly from the plug 46. Plug 46, since it is no longer suspended from reaction frame 26, becomes supported on the shoulder 132, the slip plate 126, the shoulder 121, the lip 166, the upper plate 33 the plate 38 the wall 32 and ultimately by the cluster tool 12. The shaft 272 is then un-threaded from the lower plug 64, and is dropped below the rotating plate 260 into the reaction frame 26. Then, the reaction frame 26 is rolled away from the vacuum containment vessel 20 by rolling the reaction frame on its cradle 28. See FIGS. 1 and 2. Plug lifting apparatus 500 is then secured to the upper plug 46, and the plug 46 (and filler elements 78, 80) is simply lifted from the pressure chamber 70 to expose all of the internal components of the cavity 70. (See FIG. 14.) By simply replacing the upper plug 46 on the upper body 42, rolling the reaction frame 26 back over the cavity 70, connecting the reaction frame to the upper plug with the bolt 302 and re-connecting the shaft 272 to the lower plug 64, the pressure chamber 22 is again operational.

Referring now to FIGS. 15 and 16, the preferred structure of the reaction frame 26 and carriage 28 are shown. In the preferred embodiment of the invention, the carriage 28 includes a stationary mounting frame 400, having a pair of lower frame rails 402, 404, two support tubes 406 extending upwardly therefrom, and a pair of opposed reaction frame support rails 408 extending from the support tubes 406 and generally parallel to the support rails 402, 404. A reaction frame trolley 412, from which the reaction frame 26 is suspended, is supported on the reaction frame support rails 408 on linear bearings 414 mounted on each of the rails 408. The base frame thus provides a stationary surface or reference location upon which the reaction frame trolley may be slid to move the reaction frame 26 on or off of the vacuum containment 20.

Referring still to FIGS. 15 and 16, the reaction frame trolley 412 includes a plate 430 disposed on each of the linear bearings 414, and a plurality (preferably four) of support posts 432 which extend upwardly from each of the plates 430 and support a reaction frame hanger bracket 434 extending therebetween. The hanger brackets 434 are liquid-cooled through coolant lines 426 to help control the temperature of the upper portion of the reaction frame 26. Preferably, the connection of the reaction frame hanger bracket 434 to the posts 432 is provided by providing a pilot post 440 at the upper end of each of the posts 432, engaging a pilot bore 442 on each end of the reaction frame hanger 434 and extending each of the pilot posts 440 into a pilot bore 442, and maintaining a plurality of springs 444, preferably coil compression springs, between the upper surface of the posts 432 and the reaction frame hanger 434 about the perimeter of each pilot post 440. The springs 444 provide an upward bias on the reaction frame hanger 434 within the entire range of expected reaction frame loads and travel on the posts 432. This ensures that the weight of the pressure chamber 22 and the vacuum containment vessel 20 is borne by the reaction frame 26 and the carriage 28. The reaction frame hangers 434 provide a planar mounting surface which is positionable against the sides of the reaction frame 26, such that the upper end of the reaction frame 26 is secured thereto with a plurality of bolts 450. To provide movement of the reaction frame 26 along the rails 408 of the carriage 28, a lead screw 420 is connected between the frame end 407 and a tubular frame member 448 extending from the underside of the carriage 28. By rotating this screw, the position of the reaction frame 26 on the carriage 28 may be precisely controlled.

Referring to FIGS. 1A–2B, 15 and 16, the mechanism for positioning the lower plug 64 is shown. Generally, this mechanism includes the shaft 272 (not shown in FIG. 15), which extends through a bore 451 in the lower end of the reaction frame 26, and which is connected to a cross bar (not shown) located below the lower surface of the reaction frame 26 and in between the upper rail members 408 and the reaction frame 26. The cross bar is connected, at either end thereof, to the lower ends of pneumatic cylinders 280. (See FIGS. 1A–2B.) The vertical positioning of the pneumatic cylinders 280 vertically positions the cross bar, and thus the shaft 272, relative to the reaction frame 26 for opening and closing the pressure chamber 70 for the robot blade 16 access.

Figure 17:
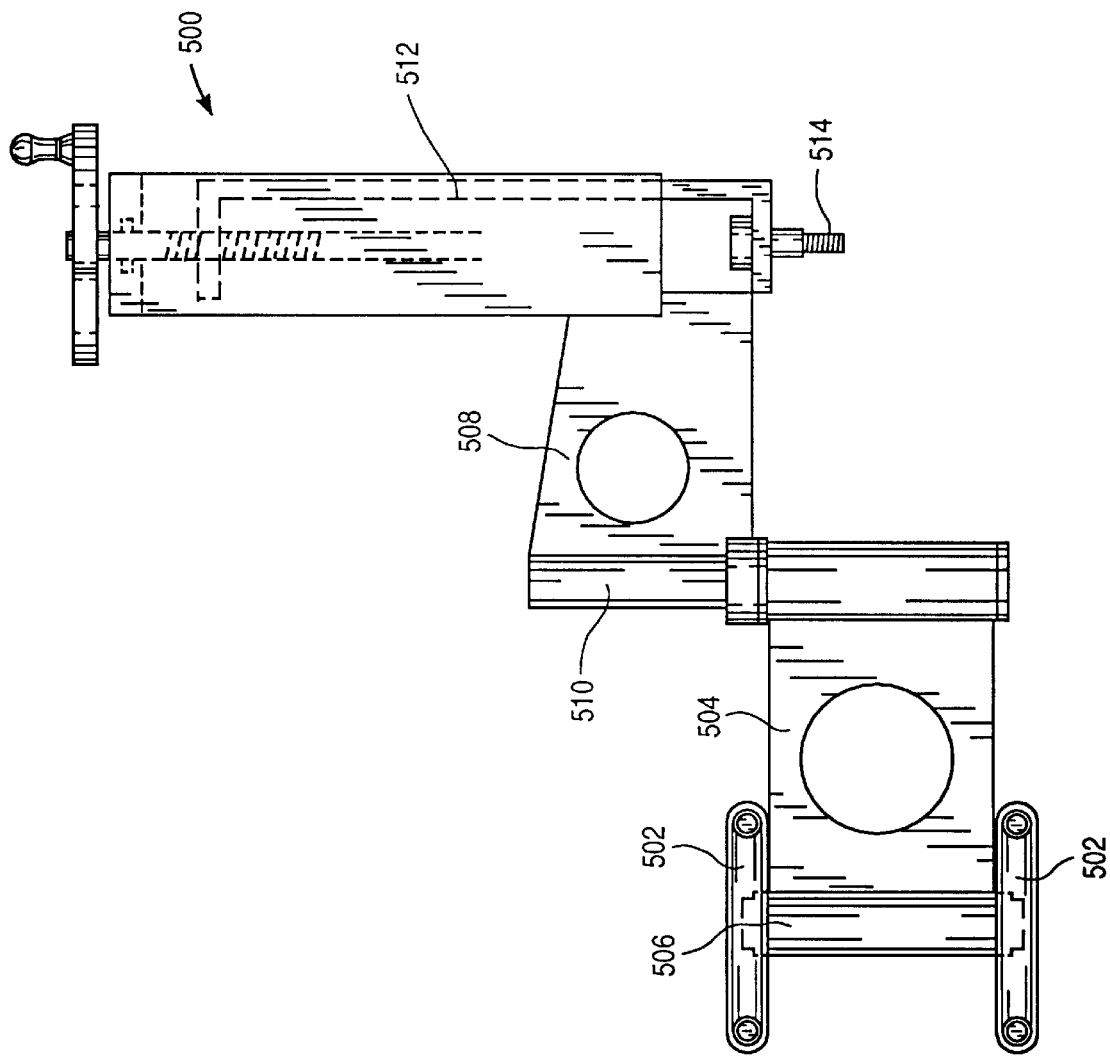
FIG. 17 is a side view of the plug lifting apparatus.
Figure 18:
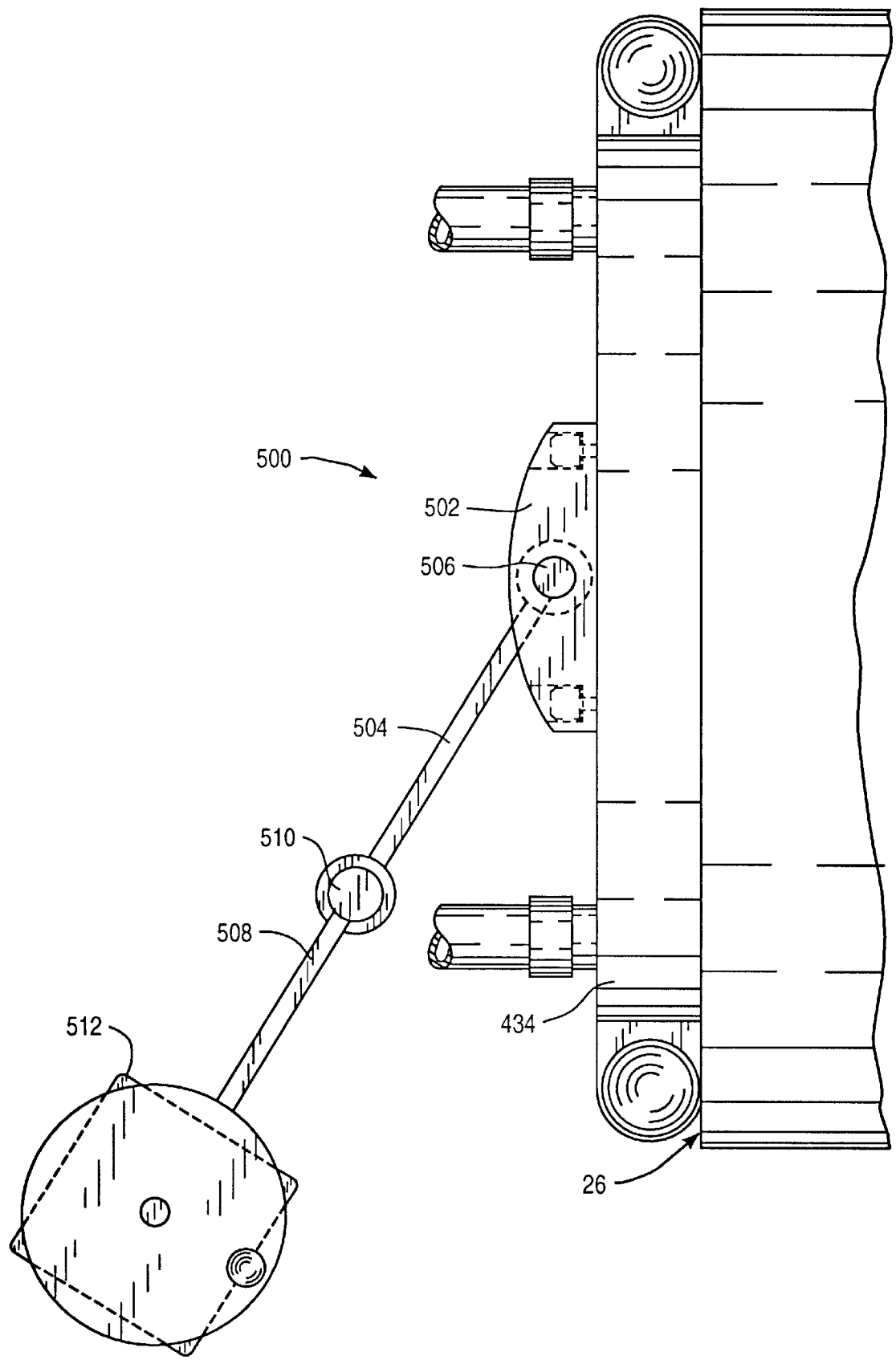
FIG. 18 is a top view of the plug lifting apparatus.

Referring now to FIGS. 17 and 18, there is shown the details of construction of the upper plug lifting apparatus 500. In the preferred embodiment of the apparatus, the plug lifting apparatus 500 is permanently mounted to the outer surface of the reaction frame support plate 434 located on the side of the reaction frame 26 adjacent to the transfer chamber 12. The plug lifting apparatus 500 preferably includes mounting plates 502 which are rigidly attached to the reaction frame support plate 434, and from which extends a first arm 504 coupled thereto in a rotary connection 506, and a second arm 508 affixed to the end of the first arm 504 by a rotational connector 510. A handwheel lifter 512 is located on the free end of the second arm 508.

As the reaction frame 26 is slid away from the transfer chamber 12, the plug lifting apparatus 500 will be positioned adjacent to the top surface of the cover plate 33 and upper plug 46. The rotary connection of the first arm 504 to the mounting plate 502, and of the two arms 504, 508, enables location of the plug lifting apparatus 500 over the center of the upper plug 46 irrespective of the distance which the plug has been moved from the transfer chamber 12 within the full range of the arms 504, 508. The handwheel lifter 512 includes a freely rotatable threaded stud 514 thereon, which is receivable in the threaded aperture 302 in the center of the upper plug 46. To connect the stud 514 with the upper plug 46, the lifter 512 is actuated to extend the threaded stud 514 to the top surface of the upper plug 46. The stud 514 is then rotated to thread the stud 514 into the upper plug 46. Then the handwheel lifter 512 is again actuated, to lift the plug 46 from the lower filler element 79 as shown in FIG. 14. Once the upper plug 46 is so removed, it may be swung to the side to enable servicing without the need to remove the upper filler element 77 or the upper plug 46 from the lifting apparatus 500. Once servicing is completed, the upper plug 46, and the upper filler element 77 connected thereto is merely swung back over the open top of the vacuum containment, and reset on the inner annular shoulder of the upper body 44.

The lifting apparatus 500 could be supplemented by or replaced by a mobile crane structure. The crane structure would typically be positioned adjacent the outer end of the carriage 28, preferably engaging the support rails 410 for proper positioning and enhanced stability. The crane structure would then be used to remove, one-at-a-time, the upper plug 46, the upper body 44, the lower body 54 and the lower plug 64 (after being unthreaded from the shaft 272). Each piece would be lifted up, swung around and lowered on to a suitable support surface for, for example, inspection, maintenance, or repair. An advantage of the mobile crane structure is that a single mobile crane structure can be used for several different ones of the apparatus 10. Also, the mobile crane structure can, unlike the lifting apparatus 500, be used to lift several of the components; apparatus 500 is best suited for removing only upper plug 46.

The reaction frame 26 is designed to produce low stresses therein. This is accomplished by curving the outer end surfaces 520, 522, preferably to be semi-cylindrical in shape. The open interior 524 of reaction frame 26 is bounded along its lateral edges by lateral sides 526 and its ends by upper and lower reaction frame ends 528, 530. The lateral sides 526 each have straight side surfaces 532. Ends 528, 530 bound interior 524 by an upper load face 532 and the lower load face 265, both of which are flat, horizontal surfaces. The load faces 265, 532 are joined to lateral side surfaces 532 by concave, U-shaped surfaces 536 of the upper and lower reaction frame ends 528, 530. This arrangement provides superior load bearing capability for reaction frame 26 by reducing stress concentrations and also minimizing weight.

The present invention is therefore seen to be directed to an apparatus for applying high pressure to a semiconductor product using a reaction frame which houses a high pressure chamber. The high pressure chamber includes a ring-like body defining an open interior and plugs at either end of the open interior to create a high pressure cavity. The following discusses various aspects and features of the preferred embodiment of the invention.

The reaction frame is a one-piece structure designed to reduce weight and internal stresses. The high pressure chamber is encircled by a vacuum chamber to accommodate transfer of semiconductor wafers between other processing equipment and the high pressure chamber. The ring-like body includes upper and lower ring-like bodies which can separate, along with their corresponding plugs, to permit access into the interior of the high pressure chamber. The movable plug is positioned using a plug mover which creates a hard physical contact between the plug and the load face of the reaction frame, as opposed to, for example, a hydraulic positioner. The ring-like bodies are designed so that their opposed, sealed surfaces move equal amounts, so as not to rub against one another, when the high pressure chamber is pressurized and depressurized to eliminate a source of particles.

The high pressure seals among the ring-like bodies and the plugs are positioned so that when the high pressure chamber is pressurized, there is a net force on the ring-like bodies forcing the ring-like bodies upwardly. The upward force exerted by the upper ring-like body is transferred to the upper plug through a low-friction slip plate to minimize particle formation due to expansion and contraction of the ring-like body during pressurization and depressurization of the high pressure cavity. Contamination of the high pressure cavity when placed under vacuum is reduced by placing vacuum regions between the ambient atmosphere and each of the high pressure seals used among the ring-like bodies and plugs.

Unused space in the heated high pressure cavity is taken up by thermally insulating filler elements; the filler elements reduce the amount of energy used, speed cycle time and help insulate the plugs from wide temperature swings. The assembly is constructed so the vacuum chamber is supported by the stationary cluster tool and the high pressure chamber is supported by the vacuum chamber to permit the reaction frame to be positioned surrounding and positioned spaced-apart from the combination; this permits the upper plug and one or more of the other components to be removed for easy access. The heater within the high pressure cavity is positioned in one embodiment to be above the semiconductor product to minimize convective currents.

The foregoing described apparatus 10 is particularly suited to operation in conjunction with a cluster tool 12, wherein a plurality of process chambers, such as metal deposition chambers, for providing the deposition layer are coupled to a common transfer chamber. However, the apparatus can also easily be used in conjunction with a stand-alone processing environment.

Figure 22:
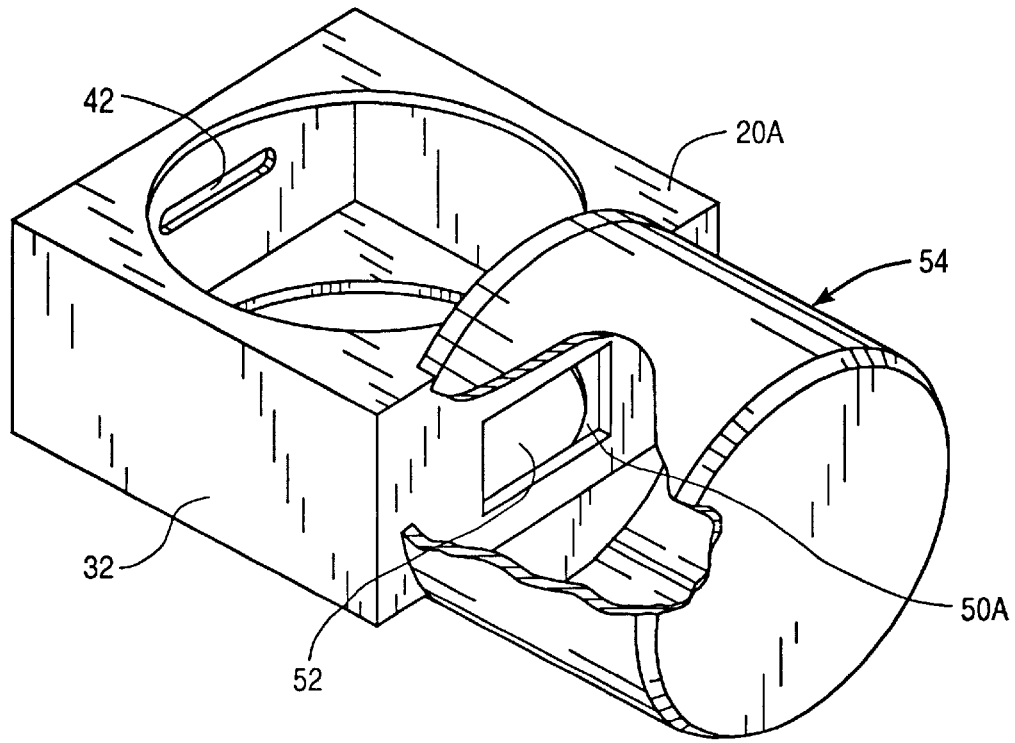
FIG. 22 is a simplified view illustrating an auxiliary vacuum containment vessel mounted to a modified vacuum containment vessel to increase the volume of the vacuum region.

The design of apparatus 10 as discussed above is preferably modified to accommodate a catastrophic leak from pressurizable cavity 70 into vacuum region 50. One method for doing so is shown in simplified form in FIG. 22, wherein like reference numerals refer to similar structures. Vacuum containment vessel 20a is shown to include slit valve 42 along one side of circumferential wall 32 and a relatively large opening 52 in circumferential wall 32 opposite the slit valve. An auxiliary vacuum containment vessel 54 is mounted to vacuum containment vessel 20a so to become a part of the vacuum containment vessel and extend the vacuum region to become an enlarged vacuum region 50A. In designing vacuum containment vessel 20A and auxiliary vacuum containment vessel 54, they need to be designed to withstand the ultra high vacuum environment created within vacuum region 50A. In the event of a catastrophic leak from pressurizable cavity 70, auxiliary vacuum containment vessel 54 is sized large enough so that enlarged vacuum region 50A will be able to accept the catastrophic leak of high pressure gasses without causing either vacuum containment vessel 28 or auxiliary vacuum containment vessel 54 to rupture. In the preferred embodiment, the volume of auxiliary vacuum containment vessel 54 is about 1.5 to 1.75 times the volume of the vacuum region 50 defined by vacuum containment vessel 20 and available to be filled with gasses from pressurizable cavity 70. These ratios can change depending upon the size of vessel 20 and whether it is desired to make vessels 20, 54 stronger or weaker, recognizing that the vessels must withstand both the high impulse pressure from a sudden pressure leak and continuous ultra-high vacuum conditions.

Figure 23:
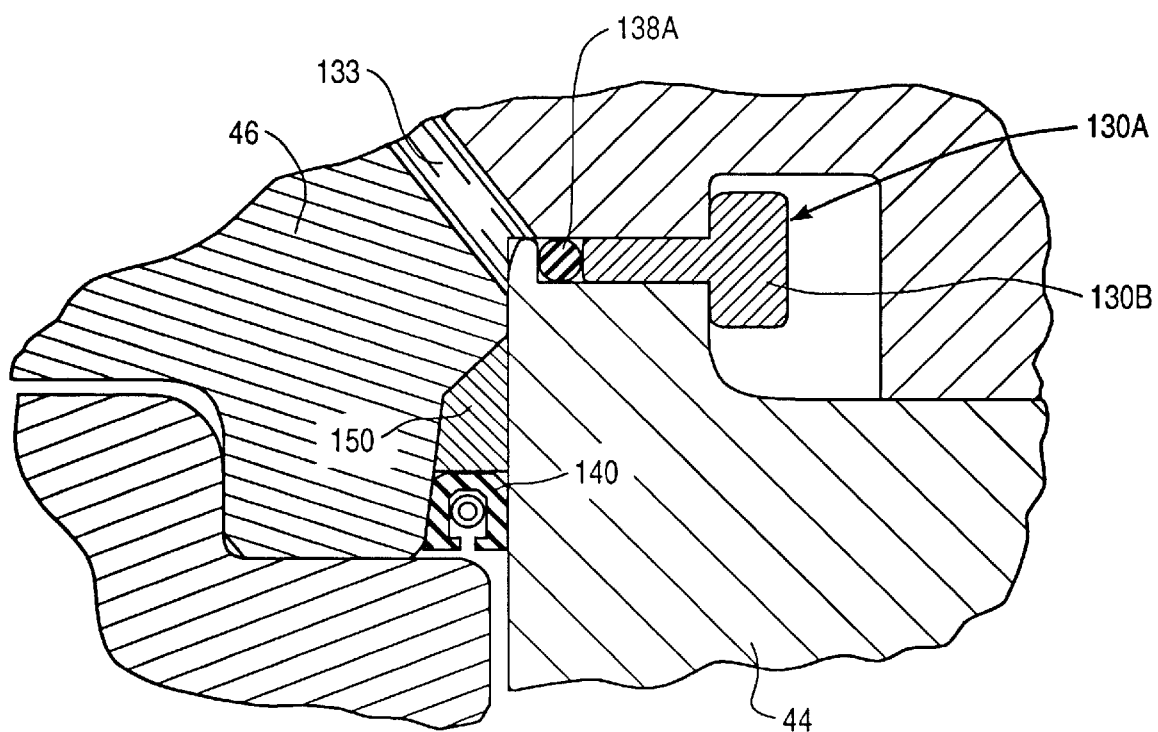
FIG. 23 illustrates a modification to the construction of the interconnection of the upper plug and upper body of FIG. 7 in which the slip plate has been modified to act as a keeper for the o-ring to permit the o-ring to withstand high pressures in the event that the primary seal fails.

FIG. 23 illustrates an improvement to the interconnection of upper plug 46 and upper body 44 shown in FIG. 7. In the embodiment of FIG. 23, slip plate 130A has been redesigned to prevent o-ring 138A from blowing past the slip plate in the event that primary seal 140 were to fail completely and suddenly. With the embodiment of FIG. 7, it is possible that under these conditions o-ring 138 could be forced out past slip plate 130, thus allowing the pressurized gas within cavity 70 to escape. Because of the enlarged portion 130B of slip plate 130A, slip plate 130A has great hoop strength. This permits slip plate 130A to act as an effective backing for o-ring 138A so that in the event that high pressure is applied to o-ring 138A, such as could result from the catastrophic failure of seal 140, o-ring 138A can function as a high pressure seal. This was not possible in the embodiment of FIG. 7. Thus, slip plate 130 serves the dual purposes of acting as the slip plate described with reference to FIG. 7 and as a backing so that o-ring 138A can act as a high pressure seal in the event that that function is needed.

Figure 24:
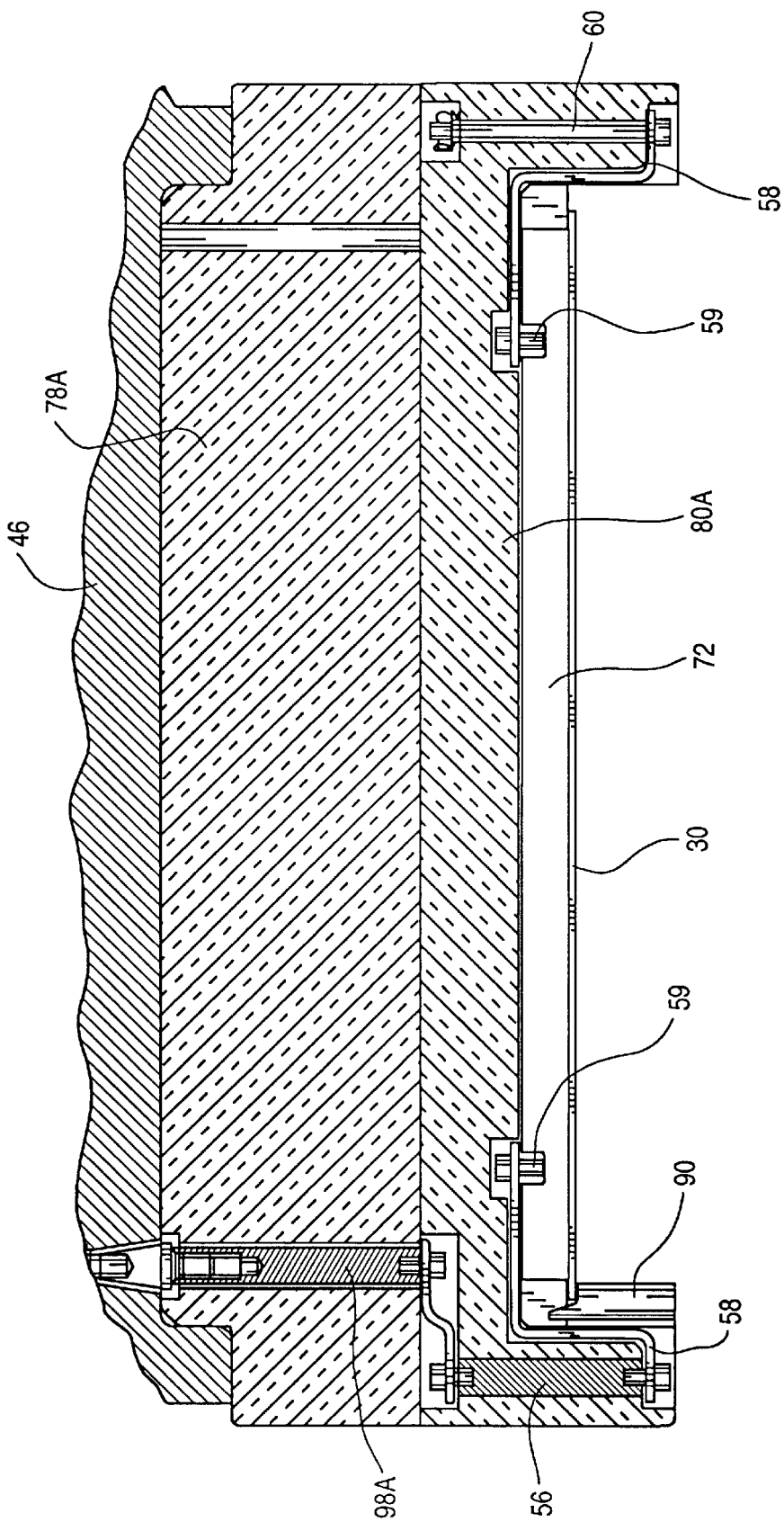
FIG. 24 shows an alternative embodiment of the uppermost and lowermost upper filler elements of FIG. 10 in which the lowermost upper filler element has been modified to eliminate through-holes above the upper heater, thus reducing thermal gradients and convective currents.

As discussed above, elimination of convection currents within substrate receiving chamber 76 is of great importance. FIG. 4 illustrates the passage of feed-through arrangements 98 through bores 104 formed in both filler plates 78, 80. This, however, permits thermal gradients and convective currents to be created due to the presence of through bores 104. To eliminate this source of convective currents, feed-through arrangements 98A are used and are constructed in a manner so as not to create any through-holes through filler element 80A in the region above upper heater 72. As can be seen in FIG. 24, feed-through arrangement 98A passes through a radially offset bore 56 formed in lowermost upper filler element 80A, bore 56 being to the side and not above upper heater 72. Upper heater 72 is actually suspended from generally z-shaped elements 58, one of which is connected to feed-through arrangement 98A by a screw 59, and thus provides an electrical conductive path to upper heater element 72, while others, one shown in FIG. 24, are connected to lower ends of bolts 60, also using screws 59. In this way, thermal gradients and convective currents which can be created with, for example, the embodiment of FIG. 4, are eliminated.

Figure 25:
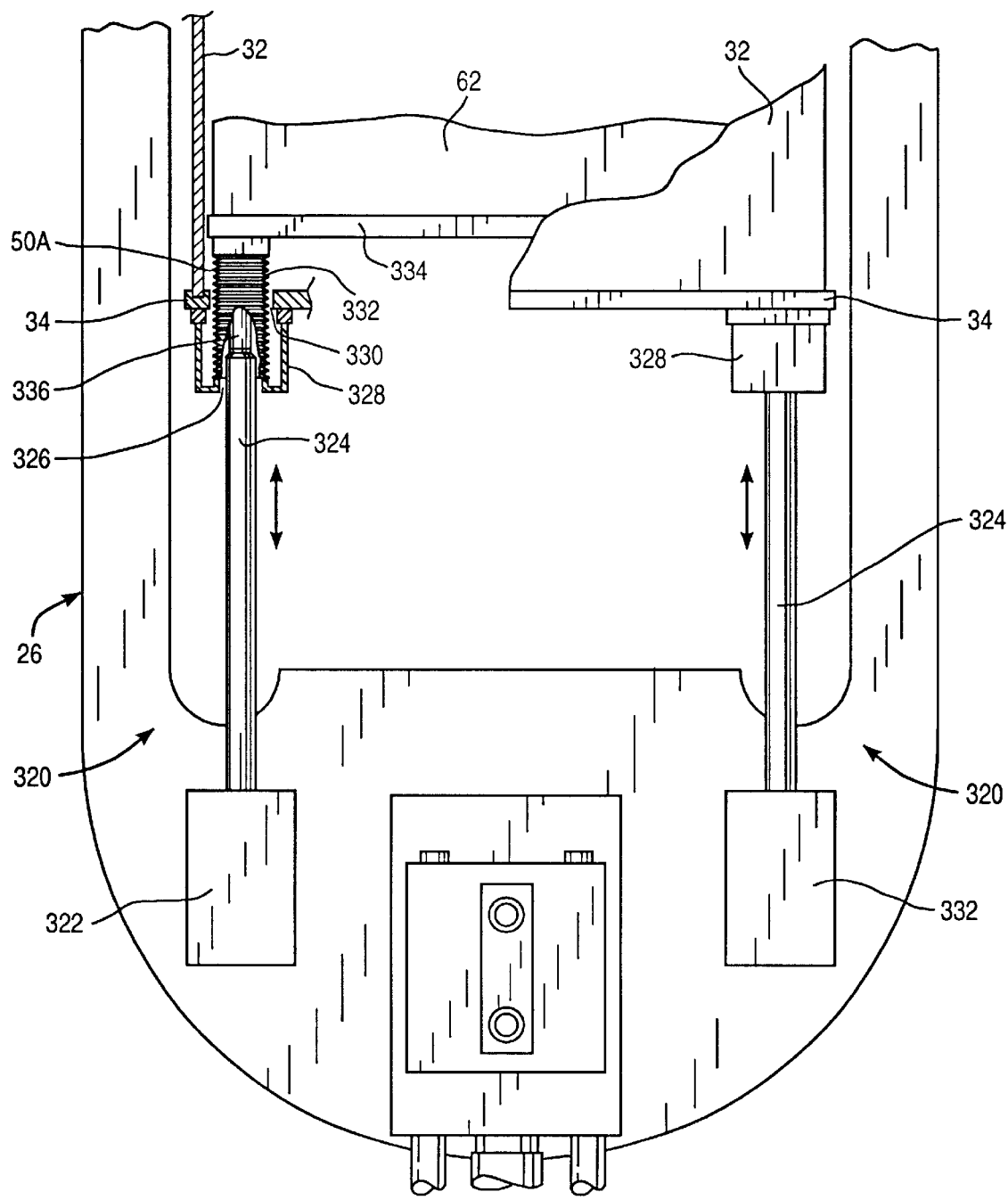
FIG. 25 shows the use of four ram assemblies and a pair of supplemental lift bars which press against the lower body in preparation of and during pressurization of the pressurizable cavity to insure a good seal is maintained between the upper and lower bodies.

The pressurization of pressurizable cavity 70 does not occur instantaneously. Rather, there is a buildup of pressure during which lower plug 64 is forced downwardly driving finger plates 268, 260 against reaction frame 26. During this movement, a certain amount of friction is created between lip seal 238 (see FIG. 19) and lower body 62. It has been found that in some situations, this friction can be sufficient to cause lower body 62 to move downwardly slightly, thus jeopardizing the seal created by lip seal 192, as shown in FIG. 9. To insure full contact between surfaces 188, four ram assemblies 320 and two lift bars 334 have been added. As shown in FIG. 25, each ram assembly 320 includes a housing 322 mounted to reaction frame 26 and a movable shaft 324 extending from each housing 322. Each movable shaft 324 passes through an opening 326 formed in a cup-shaped bellows support 328. Each bellows support 328 is mounted to annular base plate 34A at a position below an opening 330 formed in base plate 34A. A bellows 332 is sealably coupled to bellows support 328 at its lower end and to a supplemental lift bar 334 at its upper end. A second shaft 336 is secured to and extends downwardly from lift bar 334 within bellows 332. By this arrangement, each lift bar 334 can be raised or lowered by movement of a pair of shafts 324 without loosing a vacuum within vacuum region 50A. Supplemental lift bars 334 press against the lower edge of lower body 62 when shafts 324 are extended. Shafts 324 are extended at the same time as air cylinders 254 are pressurized in preparation for the pressurization of chamber 70. Therefore, during the initial pressurization of chamber 70, the movement of lower plug 64 downwardly until faces 263, 265 contact one another will not cause lower body 62 to move, since the force supplied by shafts 324 effectively counteracts the fictional force created between lip seal 238 and lower plug 62.

In the embodiment shown in FIG. 25, two lift bars 334 are used between two pairs of ram assemblies 320. Lift bars 334 could be replaced by a lift ring extending beneath the entire lower body 34A if desired.

Even though the escape of high pressure gasses into vacuum region 50 is unlikely, if such an event does occur, the high pressure gasses could also draw debris, such as wafer particles, into vacuum region 50. In such an event, it is extremely desirable to keep such contamination from entering associated process equipment through slit valve 42. To help prevent such an occurrence, a protective door 340 is mounted within vacuum region 50 to supplemental lift bar 334 as shown in FIGS. 26A, 26B and 27. Door 340 is mounted to lift bar 334 adjacent slit valve 42 and is movable with lift bar 334 from the lower position of FIG. 26A to the raised or protective position of FIGS. 26B and 27. Door 340 has an o-ring 342 mounted within an oval groove formed in an outwardly facing surface 344 of door 340. O-ring 342 is sized to circumscribe slit valve 42 when in the raised position of FIG. 26B. Proper movement between the raised and lower positions is ensured by vertically extending L-channels 346, one being mounted on either side of slit valve 42. As illustrated best in FIG. 27, protective door 340 is positioned between L-channel 346 and vacuum containment vessel 20 so that under normal circumstances it touches neither. This helps to reduce the creation of particles. If during operations vacuum region 50 is suddenly exposed to high pressure gasses, door 340 is forced against vessel 20, thus sealing slit valve 42. This movement of door 340 towards vessel 20 can be accommodated in a number of ways. In the preferred embodiment, protective door 340 is somewhat flexible itself and is mounted to lift bar 334 by a bolt 348 and compression spring 350. A relatively loose connection between door 340 and bolt 348 permits the door to pivot about bolt 348, while spring 350 normally maintains protective door 340 in its normal upright attitude spaced apart from both L-channel 346 and vessel 20.

If desired, other types of protective doors could be used as well. For example, a protected door could be mounted directly to the inner wall of vessel 20 in a manner to remain in an open position, thus providing unobstructed access to slit valve 42, under normal circumstances. The door would close upon a sudden increase in pressure with vacuum region 50 to seal slit valve 42. This could be achieved by, for example, connecting the protective door to a normally expanded bellows arrangement. The bellows arrangement would have a small orifice so that during normal pumping down procedures, the pressure within and without the bellows is about the same so that the bellows remains expanded. However, during a catastrophic failure of a seal for pressurizable cavity 70, the pressure outside the bellows would be sufficiently greater than the pressure inside the bellows to cause the bellows to collapse sufficiently to cause the door to close over slit valve 42.

Other modifications and variations can be made to the preferred embodiment without departing from the subject of he invention as defined in the following claims. For example, the vertical force on the slip plate 130 could be substantially reduced by reconfiguring the sealing surface illustrated in FIG. 7 so that the high pressure, primary seal 140 is positioned external of the inner, cylindrical force of the upper body 44 creating a vertically downwardly directed force on the upper body 44. This would result in a joint similar to the joint shown in FIG. 19 wherein the pressure on the lower face 240 exerts a vertically upwardly directed force on the lower body 62.

What is claimed is:

1. An apparatus for performing high pressure filling of apertures, comprising:

a vacuum containment having a wall portion, a first cover and a second cover;

said second cover connected to said wall portion by a movable connection;

a reaction member extendable about said first cover and said second cover; and a support member enabling a solid element connection between said reaction member and said second cover and further enabling relative movement of one of said covers with respect to the other of said covers.

2. The apparatus of claim 1, further including a pressure containment portion extendable between said first cover and said second cover; and wherein said first cover, said second cover and said pressure containment portion provide a pressurizable cavity.

3. The apparatus of claim 2, wherein said pressure containment portion includes a first body and a second body, said bodies being positionable in a first, spaced position to enable access therebetween to place of a substrate into, or remove of a substrate from, the pressurizable cavity, and a second, contacting position, wherein said bodies and said first cover and said second cover define a fluid tight pressurizable cavity.

4. The apparatus of claim 3, wherein said first and second bodies are generally ring shaped members, and each of said ring shaped members include an annular extending face thereon which, when said bodies are positioned in said second position, provide a sealing interface region.

5. The apparatus of claim 4, further including a first seal enageable between said annular extending faces when said bodies are positionable in said second position.

6. The apparatus of claim 5, wherein: said second body includes an annular recess extending inwardly of the inner diameter thereof;

at least a portion of said second cover is received in said annular recess; and a second seal extends between said annular recess and the portion of said second cover received in said annular recess.

7. The apparatus of claim 6, wherein said portion of said second cover extending inwardly of said second body includes an undercut region thereon.

8. The apparatus of claim 6, wherein:

said first body includes a sealing surface;

said first cover includes a sealing portion positionable adjacent to said sealing surface;

a third seal extends between said sealing surface and said sealing portion; and wherein the perimeter of said first seal exceeds the perimeter of either of said second seal or said third seal.

9. The apparatus of claim 3, further including a first insert received in said cavity and connected to said first cover and a second insert received in said cavity and received on said second cover, said inserts having corresponding recesses extending therein.

10. The apparatus of claim 9, further including a plurality of support fingers extending from the surface of said recess in said second insert, and a positioning member which positions said cover to position said support fingers in a first position, a second position and an intermediate position.

11. The apparatus of claim 9, further including: a heater positioned adjacent said surface of said recess in said second insert.

12. The apparatus of claim 11, further including:

an electrical feed extending from a power supply and through said first insert and terminating in a first contact;

a second lead extending from said heater and terminating in a second contact; and said contacts positioned to make contact when said bodies are positioned to seal the space therebetween.

13. The apparatus of claim 12, wherein each of said electrical contacts includes a leaf portion and a dome portion; and contact between said contacts occurs only on said dome portions.

14. The apparatus of claim 11, further including a second heater extending from the surface of said recess in said first insert.

15. The apparatus of claim 3, wherein said bodies are ring shaped members, and each ring shaped member is radially expandable by the same amount in response to an equal pressure load force on its inner perimeter.

16. The apparatus of claim 3, wherein each of said bodies thermally expand about a point at their approximate center, thereby changing size equally in all directions when exposed to changes in temperature.

17. The apparatus of claim 3, further including a first filler sub-element having a first face interconnected to said first cover and a second face;

a second filler sub-element having a first face abutting said second face of said first sub-element and a second base;

a space between said filler sub-elements defining a manifold; and a plurality of bores extending through said second filler element from said manifold to said second face.

18. The apparatus of claim 17, wherein said manifold is ported to a source of high pressure gas.

19. The apparatus of claim 17, further including an annular recess extending inwardly of said second face of said second filler sub-element and into which said bores extending from said manifold terminate.

20. The apparatus of claim 3, wherein said first cover is received over said first body;

said first body includes an upwardly extending support ridge terminating in a seal land and adjacent recess;

said cover includes a body receiving recess having a seal flange therein;

a seal is received in said seal land to seal the interface of said seal land and said cover; and a slip plate is received in said recess and forms the contact between said first body and said first cover.

21. The apparatus of claim 3, wherein:

said first cover is received over said first body; and a slip plate carried by a chosen one of said first cover and said first body for engagement with the other of said first cover and said first body.

22. The apparatus of claim 21, wherein said first body comprises a seal land and said slip plate ensures a gap between the seal land of said first body and said first cover.

23. The apparatus of claim 3, further including a slit valve extendable through said vacuum containment and accessible to said pressure cavity.

24. The apparatus of claim 1, wherein said support member includes;

a first plate having at least one extending portion and one gap;

a second plate having at least one extending portion and one gap; and wherein said extending portions of each plate are receivable in the corresponding gaps of the other plate.

25. The apparatus of claim 24, wherein said gaps and said extending portion enable telescopic movement of said plates.

26. The apparatus of claim 24, wherein said first plate is an integral portion of said second cover.

27. The apparatus of claim 24, further including a plate positioning member, said positioning member having a first position wherein said plate positioning member positions said extending portions of each of said plates in alignment with said gaps of the other of said plates and a second position wherein said positioning member aligns said extending portions for engagement against one another.

28. The apparatus of claim 24, further including a linear positioning member interconnected to one of said plates to enable linear positioning of said plates relative to one another.

29. The apparatus of claim 1, wherein:

said reaction frame is received on a slidable carriage; and said reaction frame is coupled to said carriage through a spring biased connection which positions the reaction frame at a first position with respect to said upper cover; and said upper cover is rigidly attached to said reaction frame during high pressure processing in the apparatus, and said rigid connection of said reaction frame to said upper cover compresses said spring connection.

30. The apparatus of claim 29, wherein said reaction frame is extendable from said upper plate by a spring biased connection of said reaction frame with said carriage.

31. The apparatus of claim 1, wherein said second cover is connected to said enclosure wall in a spring biased connection, whereby said spring bias maintains a bias on said second cover tending to push said second cover from contact with said reaction frame.

32. Apparatus for applying high pressure to a semiconductor product comprising:

a reaction frame;

a high pressure chamber, at least partially housed within the reaction frame, comprising:

a ring-like body;

first and second plugs, the first plug at least partially housed within the ring-like body;

at least one of the first and second plugs being moveable between open and closed positions;

said first and second plug elements and the ring-like body defining a pressurizable cavity when the plugs are in the closed position;

thermally insulating filler elements, associated with said first and second plugs, partially filling said pressurizable cavity;

a heater element positioned to heat the pressurizable cavity;

said filler elements defining a product chamber therebetween when the plugs are in the closed position;

whereby the filler elements act to thermally insulate the first and second plugs from the heater element.

33. The apparatus according to claim 32 further comprising a semiconductor product support within the pressurizable cavity.

34. The apparatus according to claim 33 further comprising upper and lower heater elements, said upper heater element positioned above the semiconductor product support so that said upper heater element is positioned above a semiconductor product supported by the semiconductor product support when a semiconductor product is supported on said semiconductor product support.

35. The apparatus according to claim 34 wherein the upper heater element is maintained at a temperature at or near a temperature of a semiconductor product within the pressurizable cavity supported by the semiconductor product support.

36. The apparatus according to claim 33 wherein the product support includes upper ends with wafer-receiving surfaces.

37. The apparatus according to claim 32 further comprising gas passageways formed through the second plug and at least one of said filler elements.

38. The apparatus according to claim 37 wherein said gas passageways further comprises manifold means for introducing gas into the pressurizable cavity.

39. The apparatus according to claim 38 wherein the manifold means include a circumferential manifold adjacent said ring-like body.

40. Apparatus for applying high pressure to a semiconductor product comprising;
 a reaction frame; and
 a high pressure chamber, at least partially housed within the reaction frame comprising:
  a circumferential body;
  first and second plugs, the first plug at least partially housed within the circumferential body and moveable relative to the second plug between open and closed positions;
  the first and second plugs and the circumferential body defining a pressurizable cavity when the plugs are in the closed position;
  a heater element associated with at least one of the first and second plugs and positioned to heat the pressurizable cavity; and
  rolling electrical contacts for the heater element moveable with the first and second plugs which engage one another as the plugs assume the closed position, said rolling electrical contacts configured to substantially eliminate sliding contact therebetween as said contacts engage and disengage.

41. The apparatus according to claim 40 further comprising a semiconductor wafer product support within the pressurizable cavity.

42. The apparatus according to claim 41 wherein the product support includes at least one wafer-receiving surface.

43. The apparatus according to claim 41 further comprising thermal-insulating filler elements housed within said pressurizable cavity.

44. The apparatus according to claim 43 wherein the rolling electrical contacts are mounted to first and second of said filler elements.

45. The apparatus according to claim 40 wherein the rolling electrical contacts include spring arms carrying curved contact elements.

46. The apparatus according to claim 43 further comprising gas passageways formed through the second plug and at least one of said filler elements.

47. The apparatus according to claim 46 wherein said gas passageways further comprises manifold means for introducing gas into the pressurizable cavity.

48. The apparatus according to claim 47 wherein said manifold means includes a circumferential manifold adjacent said circumferential body.

49. The apparatus according to claim 40 wherein said heater element is positioned above the wafer product support and maintained at a temperature at or near a temperature of a semiconductor product supported by the wafer product support within the pressurizable cavity.

50. Apparatus for applying high pressure to a semiconductor product comprising:
 a reaction frame; and
 a high pressure chamber, at least partially housed within said reaction frame, comprising:
  first and second ring-like bodies having opposed faces and open outer ends;
  first and second plugs at the open outer ends of the first and second ring-like bodies, respectively;
  fluid seals between the first and second ring-like bodies and the first and second plugs;
  the first and second ring-like bodies and the first and second plugs defining a high pressure region;
  a face fluid seal located between said opposed faces; and
  the ring-like bodies including design means for configuring said ring-like bodies move radially equal amounts along said opposed faces as the pressure within the high pressure region changes so to effectively eliminate sliding contact between said opposed faces during such pressure changes.

51. The apparatus according to claim 50 further comprising a semiconductor wafer product support within the pressurizable cavity.

52. The apparatus according to claim 51 wherein the product support includes upper ends with wafer-receiving recesses.

53. The apparatus according to claim 50 further comprising means for applying vacuum regions between said fluid seals and the ambient atmosphere and between said face fluid seal and the ambient atmosphere thereby helping to maintain the pressurizable cavity free of contaminants.

54. The apparatus according to claim 50 wherein the ring-like bodies are made using finite element analysis design techniques.

55. The apparatus according to claim 50 wherein said design means includes annular recesses at the open outer ends of said ring-like bodies.

56. The apparatus of claim 50 wherein the design means includes generally similar cross-sectional shapes for said ring-like bodies.

57. A high pressure chamber, for applying high pressure to a semiconductor product comprising:
 a chamber enclosure defining a pressurizable cavity therein;
 means for supplying heated gas to the pressurizable cavity;
 a semiconductor product region within the pressurizable cavity;
 a heater for heating a semiconductor product within the semiconductor product region; and
 the heater being positioned above the semiconductor product and maintained at a temperature at or near the temperature of the semiconductor product to help eliminate convection currents within the semiconductor product region.

58. The chamber according to claim 57 wherein the heated gas is supplied at a temperature at least as great as the lowest temperature of any component within the pressurizable cavity.

59. The chamber according to claim 57 further comprising a semiconductor wafer product support within the pressurizable cavity.

60. The chamber according to claim 59 wherein the product support includes upper ends with wafer-receiving recesses.

61. The chamber according to claim 57 further comprising a second heater positioned below the semiconductor product.

62. The chamber according to claim 57 further comprising a thermal-insulating filler element housed within said pressurizable cavity.

63. The chamber according to claim 62 wherein the thermally-insulating filler element is positioned generally above the heater and further comprises uppermost and lowermost filler elements, said lowermost filler element having no through-holes formed therethrough in an area above the heater so to prevent creating a source of convective currents.

64. The chamber according to claim 63 wherein the uppermost filler element comprises an electrical conductor bore formed therein in a region overlying the heater.

65. The chamber according to claim 62 further comprising gas passageways formed through the chamber enclosure and at least one of said filler elements.

66. The chamber according to claim 65 wherein said gas passageways further comprises manifold means for introducing low turbulence gas into the pressurizable cavity.

67. The chamber according to claim 66 wherein said manifold means includes a circumferential manifold adjacent said chamber enclosure.

68. A semiconductor product processing assembly comprising:
a reaction frame; and
a high pressure chamber, at least partially housed within said reaction frame, comprising:
first and second ring-like bodies having opposed faces and open outer ends;
first and second plugs at the open outer ends of the first and second ring-like bodies, respectively;
fluid seals between the first and second ring-like bodies and the first and second plugs respectively;
the first and second ring-like bodies and the first and second plugs defining a high pressure region;
a face fluid seal located between said opposed faces; and
means for applying vacuum regions between said fluid seals and the ambient atmosphere and between said face fluid seal and the ambient atmosphere thereby helping to maintain said high pressure region free of contaminants.

69. The apparatus according to claim 68 further comprising a semiconductor wafer product support within the pressurizable cavity.

70. The apparatus according to claim 69 wherein the product support includes upper ends with wafer-receiving recesses.

71. The apparatus according to claim 68 further comprising design means for ensuring said ring-like bodies move radially equal amounts along said opposed faces as a pressure within said pressurizable cavity changes so to effectively eliminate sliding contact between said opposed faces during such pressure changes.

72. The apparatus according to claim 68 wherein the vacuum regions applying means includes a vacuum containment wall assembly mounted about the ring-like bodies to provide a common vacuum region between said face fluid seal and the ambient atmosphere and between the ambient atmosphere and the fluid seal at the first ring-like body and the first plug.

73. The apparatus according to claim 72 further comprising an outer fluid seal between the second ring-like body and the second plug and wherein the vacuum region applying means includes a supplemental vacuum region between the outer fluid seal and the fluid seal between the second ring-like body and the second plug.

74. Apparatus for applying high pressure to a semiconductor product comprising:
a reaction frame;
a high pressure chamber, at least partially housed within the reaction frame, comprising:
a ring-like body;
first and second plugs, the first plug at least partially housed within the ring-like body;
at least said first plug being moveable between closed and open positions; and
said ring-like body and the first and second plugs defining a pressurizable cavity when the first and second plugs are in a closed position; and
a plug mover coupled to the first plug to move the first plug between the closed and open positions, the plug mover comprising a positioning plate, positionable between the reaction frame and the first plug when the plugs are in the closed position to create a hard physical connection between the first plug and the reaction frame when the cavity is pressurized.

75. The apparatus according to claim 74 further comprising a vacuum containment wall assembly mounted about the ring-like body and defining a vacuum region therebetween to form a processing assembly.

76. The apparatus according to claim 75 wherein said positioning plate is mounted to and supported by said vacuum containment wall assembly by a plate mount.

77. The apparatus according to claim 76 wherein said plate mount includes a plurality of floating spring support elements.

78. The apparatus according to claim 74 wherein the positioning plate is moveable between first and second positions.

79. The apparatus according to claim 78 wherein the positioning plate and the first plug include interengagement elements moveable between engaged and disengaged orientations, said interengagement elements being in the engaged orientation when the positioning plate is in said first position so to place said plugs in said closed position, said interengagement elements being in the disengaged orientation when the positioning plate is in said second position so to place said plugs in said open position.

80. The apparatus according to claim 79 wherein the positioning plate is rotatable and said first and second positions are rotational positions.

81. The apparatus according to claim 80 wherein the interengagement elements are finger elements having distal ends, said distal ends abutting when the positioning plate is in said first rotary position, said finger elements being interengaged when the positioning plate is in said second rotary orientation.

82. The apparatus according to claim 74 wherein said ring-like body comprises first and second ring-like bodies associated with the first and second plugs, the plug mover moving the first ring-like body with the first plug as the first plug is moved between the first and second positions.

83. The apparatus according to claim 82 further comprising means for selectively driving the first ring-like body against the second ring-like body to insure a proper seal therebetween.

84. The apparatus according to claim 82 further comprising a vacuum containment wall assembly mounted about the ring-like body and defining a vacuum region therebetween to form a processing assembly wherein the vacuum containment wall assembly includes a sealable access door.

85. The apparatus according to claim 84 wherein the plug mover moves the first plug and the first ring-like body therewith to be to an intermediate position between said open and closed positions to permit access to said pressurizable cavity.

86. The apparatus according to claim 74 further comprising a semiconductor wafer product support within the pressurizable cavity.

87. The apparatus according to claim 86 wherein the product support includes upper ends with wafer-receiving recesses.

88. An apparatus for performing high pressure filling of apertures, comprising:

a vacuum containment;

a pressure containment, at least partially housed within the vacuum containment, defining a pressurizable region;

a vacuum region defined by the vacuum containment and the pressure containment; and the vacuum containment comprising means for accommodating a catastrophic leak from the pressurizable region into the vacuum region.

89. An apparatus for performing high pressure filling of apertures, comprising:

a vacuum containment;

a pressure containment, at least partially housed within the vacuum containment, defining a pressurizable region;

a vacuum region defined by the vacuum containment and the pressure containment;

the vacuum containment comprising a wall having a slit valve opening therein; and means, located within the vacuum region, for selectively positioning a protective door over the slit-valve opening while the pressurizable region is pressurized.

90. The apparatus according to claim 89 wherein the protective door comprises an o-ring seal sized to surround the slit valve opening.

* * * * *